US012265242B2

(12) United States Patent
Xu et al.

(10) Patent No.: US 12,265,242 B2
(45) Date of Patent: Apr. 1, 2025

(54) REFLECTIVE POLARIZER AND OPTICAL SYSTEM

(71) Applicant: 3M INNOVATIVE PROPERTIES COMPANY, St. Paul, MN (US)

(72) Inventors: Fuguo Xu, Shanghai (CN); Adam D. Haag, Woodbury, MN (US); Martin E. Denker, Vadnais Heights, MN (US); Timothy J. Nevitt, Red Wing, MN (US)

(73) Assignee: 3M INNOVATIVE PROPERTIES COMPANY, St. Paul, MN (US)

( * ) Notice: Subject to any disclaimer, the term of this patent is extended or adjusted under 35 U.S.C. 154(b) by 389 days.

(21) Appl. No.: 17/636,394

(22) PCT Filed: Sep. 27, 2019

(86) PCT No.: PCT/CN2019/108348
§ 371 (c)(1),
(2) Date: Feb. 18, 2022

(87) PCT Pub. No.: WO2021/056372
PCT Pub. Date: Apr. 1, 2021

(65) Prior Publication Data
US 2022/0299692 A1    Sep. 22, 2022

(51) Int. Cl.
*G02B 5/30* (2006.01)
*G02B 5/26* (2006.01)
(Continued)

(52) U.S. Cl.
CPC ............. *G02B 5/3041* (2013.01); *G02B 5/26* (2013.01); *H10K 50/86* (2023.02); *H10K 59/35* (2023.02); *H10K 59/12* (2023.02)

(58) Field of Classification Search
CPC .... G02B 5/3025; G02B 5/3041; G02B 5/305; G02B 5/26; H10K 59/35; H10K 50/86
(Continued)

(56) References Cited

U.S. PATENT DOCUMENTS 5,808,794 A * 9/1998 Weber ................. G02F 1/13362
349/97
5,882,774 A    3/1999 Jonza
(Continued)

FOREIGN PATENT DOCUMENTS

CN        1776505        5/2006
CN      101021643 A      8/2007
(Continued)

OTHER PUBLICATIONS

Denker, "Advanced Polarizer Film for Improved Performance of Liquid Crystal Displays," SID International Conference, 2006, pp. 1528-1530.
(Continued)

*Primary Examiner* — Ricky D Shafer
(74) *Attorney, Agent, or Firm* — Clifton F. Richardson

(57) ABSTRACT

An optical system (200) includes an emissive display (220) and a reflective polarizer (100) disposed on the display (220). The display (220) includes a blue pixel (222b) emitting light having a peak at a wavelength $\lambda_b$. For substantially normally incident light: for the wavelength $\lambda_b$, the reflective polarizer (100) reflects at least 30% of the incident light having a first polarization state (b) and transmits at least 75% of the incident light having an orthogonal second polarization state(a); and for at least one wavelength $\lambda_1$ greater than $\lambda_b$, $\lambda_1-\lambda_b \leq 50$ nm, the reflective polarizer (100) transmits at least 75% of the incident light for each of the first and second polarization states. For the wavelength $\lambda_b$, the reflective polarizer (100) has a maximum optical transmittance $T_{max}$
(Continued)

for light incident at a first incident angle, and an optical transmittance $T_{max}/2$ for light incident at a second incident angle greater than the first incident angle by less than about 50 degrees.

4 Claims, 15 Drawing Sheets

(51) Int. Cl.
    *H10K 50/86*     (2023.01)
    *H10K 59/35*     (2023.01)
    *H10K 59/12*     (2023.01)

(58) Field of Classification Search
    USPC .......................... 359/485.01, 485.03, 487.04
    See application file for complete search history.

(56) References Cited

U.S. PATENT DOCUMENTS

| | | | |
|---|---|---|---|
| 6,157,490 | A | 12/2000 | Wheatley |
| 6,179,948 | B1 | 1/2001 | Merrill |
| 6,783,349 | B2 | 8/2004 | Neavin |
| 7,456,915 | B2 | 11/2008 | Lazarev |
| 8,969,857 | B2 | 3/2015 | Kim |
| 9,322,967 | B2 | 4/2016 | Weber |
| 9,441,809 | B2 | 9/2016 | Nevitt |
| 9,551,818 | B2 | 1/2017 | Weber |
| 9,690,025 | B2 | 6/2017 | Qin |
| 9,773,847 | B2 | 9/2017 | Epstein |
| 10,185,068 | B2 | 1/2019 | Johnson |
| 11,619,823 | B2 * | 4/2023 | Le .................... G02B 27/0093 359/802 |
| 2002/0093284 | A1 * | 7/2002 | Adachi .............. H10K 59/8791 313/506 |
| 2006/0028600 | A1 | 2/2006 | Wu |
| 2006/0109399 | A1 | 5/2006 | Kubota |
| 2010/0254002 | A1 | 10/2010 | Merrill |
| 2011/0272849 | A1 | 11/2011 | Neavin |
| 2012/0222295 | A1 | 9/2012 | Chawgo |
| 2013/0038201 | A1 | 2/2013 | Fukuda |
| 2015/0219814 | A1 | 8/2015 | Qin |
| 2015/0325816 | A1 | 11/2015 | Haag |
| 2020/0326461 | A1 * | 10/2020 | Nevitt ...................... G02B 1/04 |
| 2021/0294012 | A1 * | 9/2021 | Wong .................. G02B 5/3083 |

FOREIGN PATENT DOCUMENTS

| | | |
|---|---|---|
| CN | 101124510 | 2/2008 |
| CN | 103207426 | 7/2013 |
| CN | 104823299 | 8/2015 |
| CN | 105378517 A | 3/2016 |
| CN | 105388625 A | 3/2016 |
| CN | 105408810 A | 3/2016 |
| CN | 110023798 A | 7/2019 |
| JP | 2017181889 A | 10/2017 |
| KR | 20140021239 A | 2/2014 |
| KR | 20150078392 A | 7/2015 |
| WO | WO1995017699 A1 | 6/1995 |
| WO | WO 2006-092878 | 9/2006 |
| WO | WO 2014-085199 | 6/2014 |
| WO | WO 2014-197539 | 12/2014 |
| WO | WO 2018-163009 | 9/2018 |
| WO | WO 2018-178817 | 10/2018 |
| WO | WO 2020-051874 | 3/2020 |

OTHER PUBLICATIONS

International Search report for PCT International Application No. PCT/CN2019/108348 mailed on Jun. 22, 2020, 5 pages.

* cited by examiner

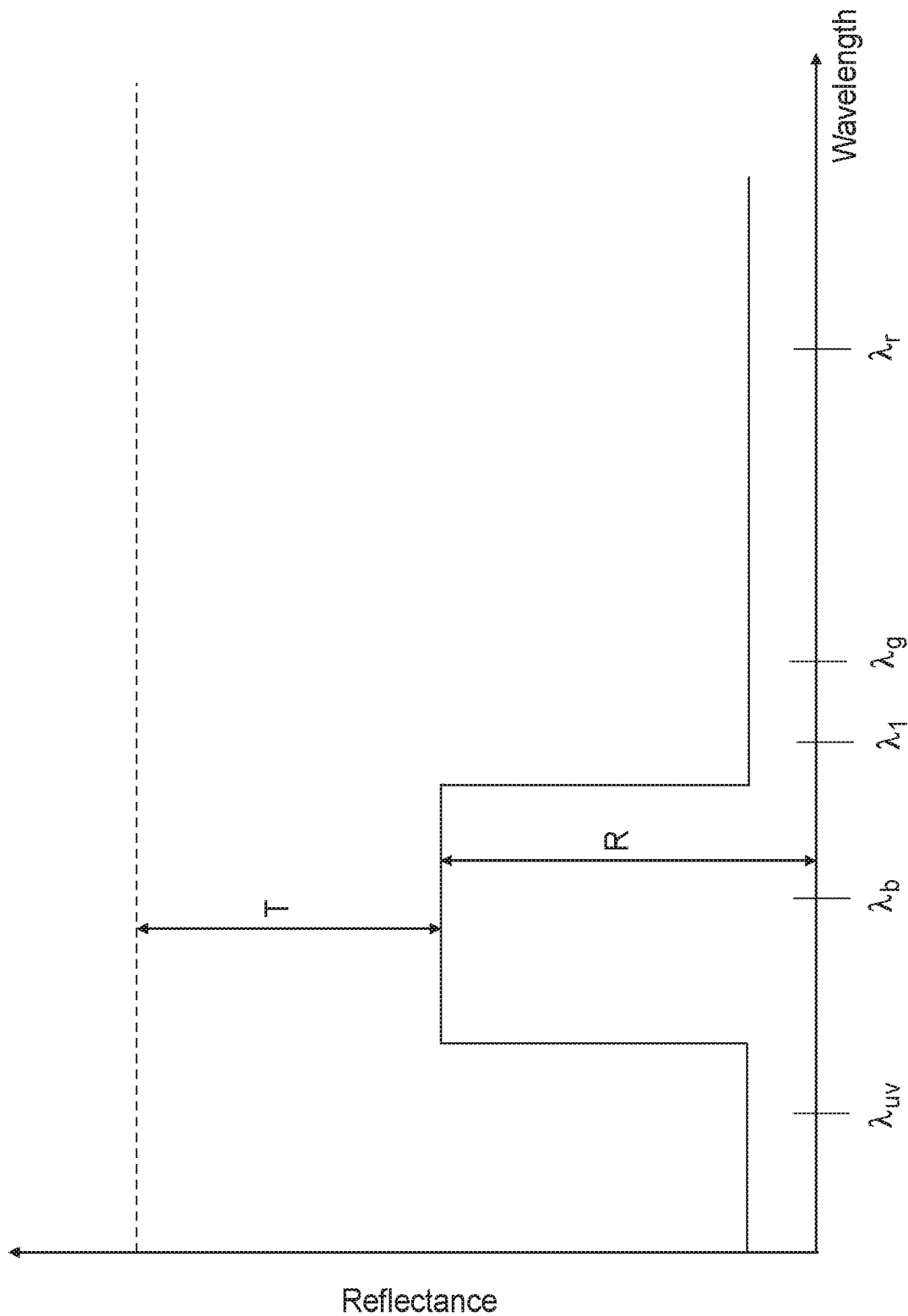

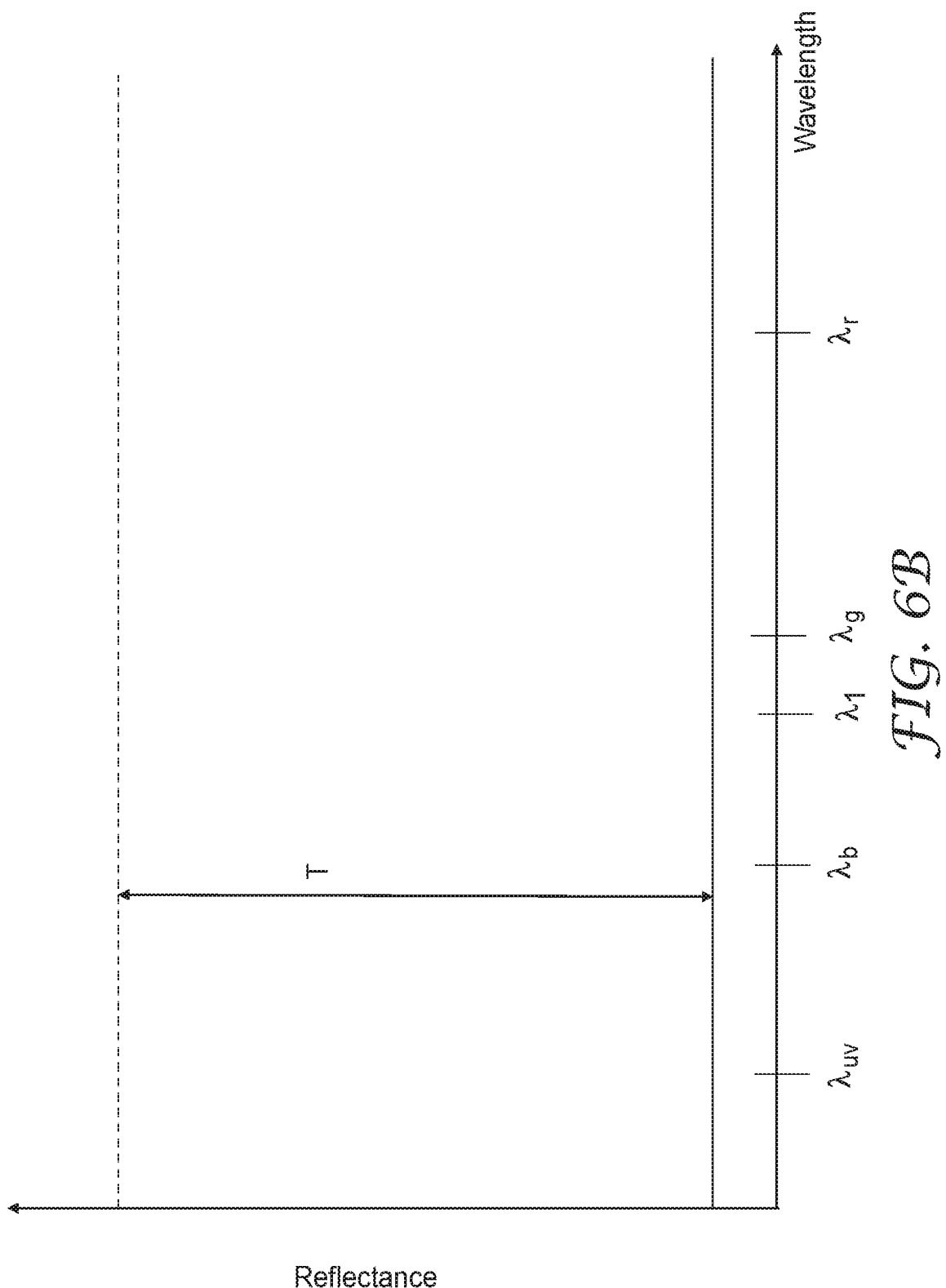

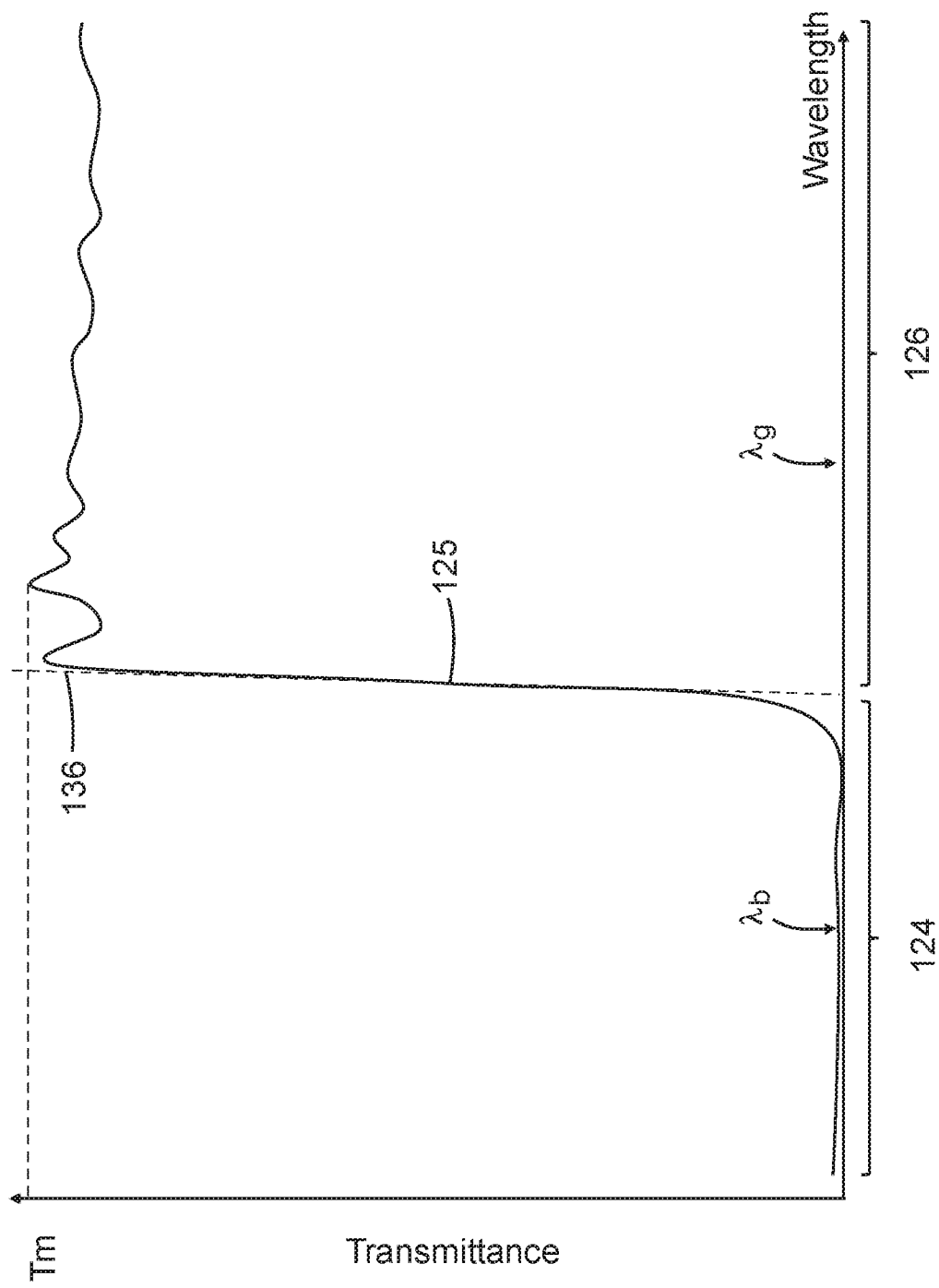

REFLECTIVE POLARIZER AND OPTICAL SYSTEM

CROSS REFERENCE TO RELATED APPLICATIONS

This application is a national stage filing under 35 U.S.C. 371 of PCT/CN2019/108348, filed Sep. 27, 2019, the disclosure of which is incorporated by reference in its entirety herein.

BACKGROUND

Organic light emitting diode (OLED) displays typically include a circular polarizer to reduce reflection of ambient light from the display.

SUMMARY

In some aspects of the present description, an optical system including an emissive display, a linear absorbing polarizer layer disposed on the display, and a reflective polarizer disposed between the linear absorbing polarizer layer and the display is provided. The emissive display is configured to emit an image and includes a blue pixel configured to emit a blue light where the emitted blue light has a blue peak at a blue wavelength $\lambda_b$. The reflective polarizer is configured to receive the image emitted by the display. For substantially normally incident light: for the blue wavelength $\lambda_b$, the reflective polarizer reflects at least 30% of the incident light having a first polarization state and transmits at least 75% of the incident light having an orthogonal second polarization state; and for at least one wavelength $\lambda_1$ greater than $\lambda_b$, $\lambda_1$-$\lambda_b$≤50 nm, the reflective polarizer transmits at least 75% of the incident light for each of the first and second polarization states. For the blue wavelength $\lambda_b$, the reflective polarizer has a maximum optical transmittance $T_{max}$ for light incident at a first incident angle, and an optical transmittance $T_{max}/2$ for light incident at a second incident angle greater than the first incident angle by less than about 50 degrees.

In some aspects of the present description, a display system including an emissive display and a reflective polarizer disposed on the emissive display is provided. The emissive display is configured to emit an image for viewing by a viewer. The emissive display includes a blue pixel configured to emit blue light having a blue peak at a blue wavelength $\lambda_b$, a green pixel configured to emit green light having a green peak at a green wavelength $\lambda_g$, and a red pixel configured to emit red light having a red peak at a red wavelength $\lambda_r$. For a substantially normally incident light: for the blue wavelength $\lambda_b$, the reflective polarizer reflects at least 60% of light having a first polarization state and transmits at least 60% of light having an orthogonal second polarization state; and for each of the green and red wavelengths $\lambda_g$ and $\lambda_r$, the reflective polarizer transmits at least 40% of the incident light for each of the first and second polarization states. For a light having the red wavelength $\lambda_r$ and incident at an incident angle greater than about 20 degrees, the reflective polarizer reflects at least 50% of light having the first polarization state and transmits at least 50% of light having the second polarization state.

In some aspects of the present description, an optical system including an emissive display and a reflective polarizer disposed on the display is provided. The emissive display is configured to emit an image in a visible wavelength range extending at least from about 430 nm to about 640 nm. The emissive display includes a blue pixel configured to emit a blue light having a blue peak at a blue wavelength $\lambda_b$, a green pixel configured to emit a green light having a green peak at a green wavelength $\lambda_g$, and a red pixel configured to emit a red light having a red peak at a red wavelength $\lambda_r$. For a substantially normally incident light: for the wavelength $\lambda_b$, the reflective polarizer reflects at least 30% of the incident light having a first polarization state and transmits at least 75% of the incident light having a second polarization state orthogonal to the first polarization state; for the wavelength $\lambda_r$, the reflective polarizer reflects at most 40% of the incident light having the first polarization state; for each wavelength in the visible wavelength range, the reflective polarizer transmits at least 60% of the incident light having the second polarization state; and for at least one wavelength $\lambda_{uv}$ less than $\lambda_b$, $\lambda_b$-$\lambda_{uv}$≤100 nm, the reflective polarizer transmits at least 40% of the incident light for each of the first and second polarization states.

In some aspects of the present description, an optical system including an emissive display and a reflective polarizer disposed on the display is provided. The display is configured to emit an image in a visible wavelength range. The display includes a blue pixel configured to emit a blue light having a blue peak at a blue wavelength $\lambda_b$, a green pixel configured to emit a green light having a green peak at a green wavelength $\lambda_g$, and a red pixel configured to emit a red light having a red peak at a red wavelength $\lambda_r$. For a substantially normally incident light: for the wavelength $\lambda_b$, the reflective polarizer reflects at least 60% of the incident light having a first polarization state; for each of the wavelengths $\lambda_g$ and $\lambda_r$, the reflective polarizer transmits at least 60% of the incident light having the first polarization state; for each wavelength in the visible wavelength range, the reflective polarizer transmits at least 60% of the incident light having a second polarization state orthogonal to the first polarization state; and for the first polarization state, an optical transmittance of the reflective polarizer comprises a band edge at least a portion of which is disposed in the visible wavelength range, such that a best linear fit to the band edge correlating the optical transmittance to wavelength at least across a wavelength range where the optical transmittance increases from about 20% of a maximum transmittance of the reflective polarizer in the visible wavelength range to about 70% of the maximum transmittance of the reflective polarizer in the visible wavelength range has a slope that is greater than about 7%/nm.

In some aspects of the present description, a multilayer polymeric reflective polarizer is provided. The reflective polarizer includes a plurality of alternating first and second polymeric layers where an average thickness of each of the layers is less than about 400 nm. For a substantially normally incident light: an optical transmittance of the reflective polarizer for a first polarization state includes a band edge separating first and second wavelength ranges where at least a portion of each of the first and second wavelength ranges is disposed in a visible wavelength range; for at least one wavelength $\lambda_b$ in the first wavelength range, the reflective polarizer reflects at least 70% of the incident light having the first polarization state; for each wavelength in the second wavelength range, the reflective polarizer transmits at least 60% of the incident light having the first polarization state; for each wavelength in the first and second wavelength ranges, the reflective polarizer transmits at least 60% of the incident light having a second polarization state orthogonal to the first polarization state; the reflective polarizer has a maximum transmittance in the first and second wavelength ranges for the first polarization state; and a best linear fit to the band edge correlating the optical transmittance to wavelength at least across a wavelength range where the optical transmittance increases from about 20% of the maximum transmittance to about 70% of the maximum transmittance has a slope that is greater than about 7%/nm.

BRIEF DESCRIPTION OF THE DRAWINGS

FIGS. 6A-6B are schematic plots of optical reflectance versus wavelength for a reflective polarizer for substantially normally incident light in a block polarization state and in a pass polarization state, respectively;

FIG. 8 is a schematic plot of the optical transmittance of a reflective polarizer versus wavelength for a block polarization state;

DETAILED DESCRIPTION

Figure 1A:
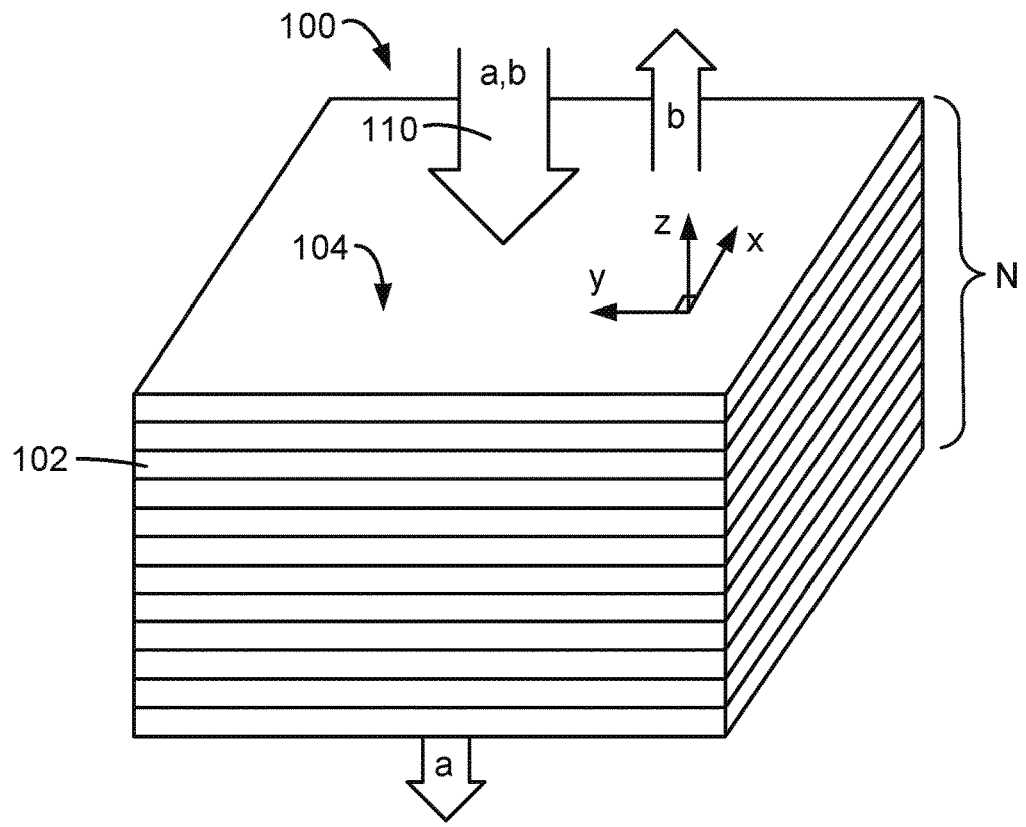
FIG. 1A is a schematic perspective view of a reflective polarizer.

In the following description, reference is made to the accompanying drawings that form a part hereof and in which various embodiments are shown by way of illustration. The drawings are not necessarily to scale. It is to be understood that other embodiments are contemplated and may be made without departing from the scope or spirit of the present description. The following detailed description, therefore, is not to be taken in a limiting sense.

According to some embodiments of the present description, a reflective polarizer having a reflection band with a band edge in the visible spectrum is provided. It has been found that such reflective polarizers are useful for improving performance of a display system when the reflective polarizer is disposed to receive a light output of the display. For example, the reflective polarizer can be used in a circular polarizer disposed on an organic light emitting diode (OLED) display to improve the brightness of the display and/or the color gamut of the display without causing ghosting or other image degradations. Utilizing a broadband reflective polarizer in the circular polarizer of an OLED display for increasing the brightness of the display due to light recycling is described in U.S. Pat. No. 9,773,847 (Epstein et al.). As described in International Pat. Appl. No. CN2018/105712 (Xu et al.), it has been found that utilizing a notch reflective polarizer having band edges in the visible spectrum can increase the brightness and/or the color gamut of the display while producing substantially less or substantially no ghosting compared to using a broadband reflective polarizer and/or producing a reduced reflection of ambient light compared to using a broadband reflective polarizer.

According to some embodiments of the present description, it has been found that using a reflective polarizer having a single visible reflection band at normal incidence for blue wavelengths provides increased recycling of light from blue pixels without producing substantial undesired ambient reflection and without producing substantial ghosting. The blue pixels of OLED devices are typically less efficient and/or have shorter lifetimes than other emitters. Recycling in the blue can therefore improve overall efficiency and/or display lifetime. In some embodiments, the strength of the reflection band may be limited (e.g., reflectance less than about 80%, or less than about 70%) to reduce reflection of ambient light from the display system. In some embodiments, the width of the reflection band is limited to reduce reflection of ambient light and/or to reduce the color shift of the reflected ambient light with angle of incidence. The reflection band may have a left band edge between 400 nm and a peak emission wavelength of a blue pixel and/or may have a right band edge between the blue peak emission wavelength and a peak emission wavelength of a green pixel. In some embodiments, the reflection band may have a sharp band edge between blue wavelengths and green wavelengths and/or a sharp band edge between blue wavelengths and shorter blue wavelengths or near ultraviolet wavelengths. Using sharp band edge(s) can limit the reflected wavelengths to emitter wavelengths and reduce reflection of ambient light. In some embodiments, the reflective polarizer may further include a near-infrared reflection band at normal incidence which shifts into red wavelengths at off-normal incidence which provides recycling in the red at higher viewing angles in order to reduce an overall color shift of the display with viewing angle. In some embodiments, the reflective polarizer may be a collimating reflective polarizer. Using a collimating reflective polarizer with a reflection band in the blue provides greater recycling in the blue at near normal viewing angles than at larger viewing angles and this can reduce a color shift of the display with increasing viewing angle according to some embodiments.

Figure 1B:
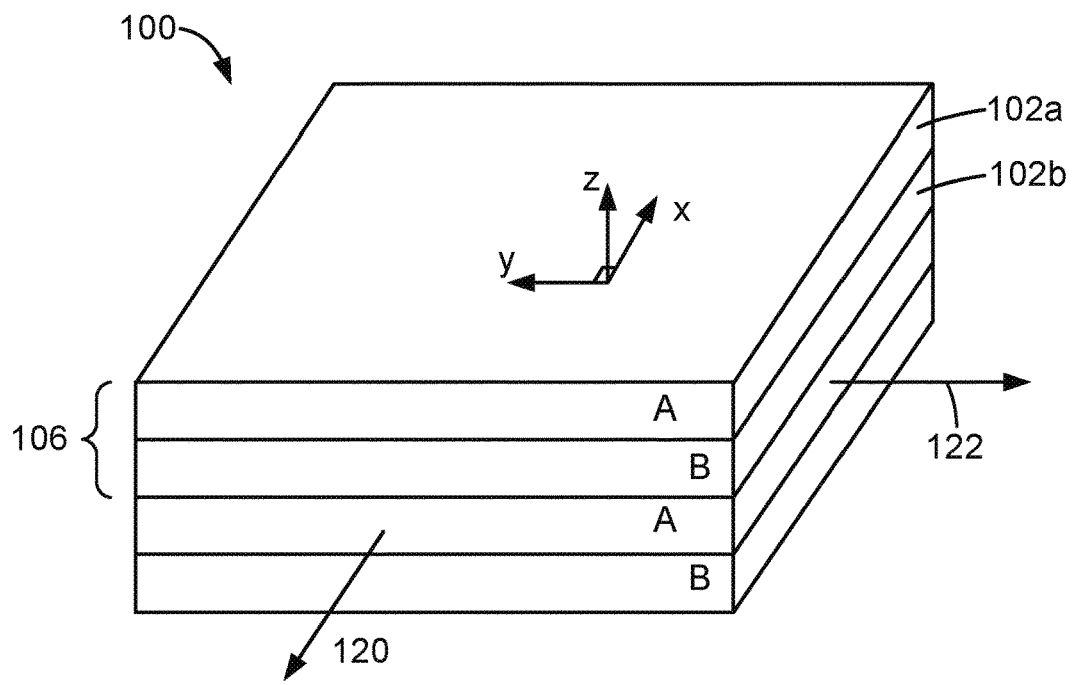
FIG. 1B is a schematic perspective diagram of a segment of the reflective polarizer of FIG. 1A.

In some embodiments, the reflective polarizers described herein may be characterized as a multilayer polymeric reflective polarizer having plurality of optical layers (e.g., interference layers and/or alternating first and second layers) configured to selectively transmit and reflect light within a predetermined wavelength range. For example, FIG. 1A is a schematic perspective view of a reflective polarizer 100 that includes a plurality of layers 102. FIG. 1B is a schematic perspective diagram of a segment of the reflective polarizer 100 illustrating alternating first and second polymeric layers 102a and 102b. FIGS. 1A-1B include a coordinate system that defines x, y, and z directions. During use, light incident on a major surface of the reflective polarizer 100 (e.g., surface 104), depicted by incident light 110 may enter a first layer of reflective polarizer 100 and propagate through the plurality of layers 102, undergoing select reflection or transmission by optical interference depending on the polarization state of incident light 110. Incident light 110 may include a first polarization state (b) and a second polarization state (a) that are mutually orthogonal to one another. The second polarization state (a) may be considered as the "pass" state while the first polarization state (b) may be considered as the "reflected" or "block" state. As incident light 110 propagates through plurality of layers 102, portions of the light in the first polarization state (b) will be reflected by adjacent layers resulting in the first polarization state (b) being reflected by reflective polarizer 100, while a portion of the light in the second polarization state (a) collectively passes through the reflective polarizer 100. The first polarization state (b) may have the electric field along the x-axis or stretch axis 120 and the second polarization state (a) may have the electric field along the y-axis or non-stretch axis 122, for example. In some embodiments, the layers 102 may be characterized as a series of two-layer unit cells or optical repeat units (e.g., each optical repeat unit defined by a pair of the first and second polymeric layers 102a and 102b). The thickness of each unit cell may be configured to reflect a target wavelength within the predetermined wavelength range.

In some embodiments, the reflective polarizer 100 includes less than about 1200 (N) interference layers 102, where each interference layer 102 reflects or transmits incident light 110 primarily by optical interference. In some embodiments, the reflective polarizer 100 includes less than about 1000, or less than about 700, or less than about 400 interference layers 102. While 1200 or more interference layers 102 may be included in the reflective polarizer 100, in some cases, it may be desirable to achieve the desired optical performance using fewer total layers in order to reduce the overall thickness of the film, since reducing the overall thickness of a display assembly is preferable in many applications. In some cases, it may be desired to include a larger number interference layers 102 when it is desired to reduce block state leakage. In some embodiments, the total number N of interference layers 102 is greater than about 50, or greater than about 100, or greater than about 150, or greater than about 200. For example, in some embodiments, the reflective polarizer includes at total number of alternating first and second polymeric layers in a range of about 100 to about 1000.

In some embodiments, each layer of the alternating first and second polymeric layers 102a and 102b has an average thickness (unweighted mean over the layer of the thickness) of less than about 400 nm. In some embodiments, the alternating first and second polymeric layers 102a and 102b are interference layers. Interference layers may be described as reflecting and transmitting light primarily by optical interference when the reflectance and transmittance of the interference layers can be reasonably described by optical interference or reasonably accurately modeled as resulting from optical interference. Adjacent pairs of interference layers having differing refractive indices reflect light by optical interference when the pair has a combined optical thickness (refractive index along the block axis times physical thickness) of ½ the wavelength of the light. Interference layers typically have a physical thickness of less than about 400 nm, or less than about 200 nm. In some embodiments, each polymeric interference layer has an average thickness (unweighted average of the physical thickness over the layer) in a range of about 45 nanometers to about 200 nanometers. Noninterference layers have an optical thickness too large to contribute to the reflection of visible light via interference. Noninterference layers typically have a physical thickness of at least 1 micrometer, or at least 5 micrometers. In some embodiments, the reflective polarizer includes packets of interference layers where adjacent packets are separated by one or more noninterference layers.

The reflective polarizers can be made using any suitable light-transmissive materials, but in many cases, it is beneficial to use low absorption polymer materials. With such materials, absorption of the reflective polarizer over visible and infrared wavelengths can be made small or negligible, such that the sum of reflection and transmission for the reflective polarizer, at any given wavelength and for any specified angle of incidence and polarization state, is approximately 100%, i.e., $R+T \approx 100\%$.

Exemplary reflective polarizers are composed of polymer materials and may be fabricated using coextruding, casting, and orienting processes. Suitable materials for the alternating polymeric layers include, for example, polyethylene naphthalate (PEN), copolymers containing PEN and polyesters (e.g., polyethylene terephthalate (PET) or dibenzoic acid), glycol modified polyethylene terephthalate, polycarbonate (PC), or blends of these classes of materials. Reference is made to U.S. Pat. No. 5,882,774 (Jonza et al.) "Optical Film", U.S. Pat. No. 6,179,948 (Merrill et al.) "Optical Film and Process for Manufacture Thereof", U.S. Pat. No. 6,783,349 (Neavin et al.) "Apparatus for Making Multilayer Optical Films", and patent application publication US 2011/0272849 (Neavin et al.) "Feedblock for Manufacturing Multilayer Polymeric Films". The multilayer optical film may be formed by coextrusion of the polymers as described in any of the aforementioned references. In brief summary, the fabrication method can include: (a) providing at least a first and a second stream of resin corresponding to the first and second polymers to be used in the finished film; (b) dividing the first and the second streams into a plurality of layers using a suitable feedblock; (c) passing the composite stream through an extrusion die to form a multilayer web in which each layer is generally parallel to the major surface of adjacent layers; and (d) casting the multilayer web onto a chill roll, sometimes referred to as a casting wheel or casting drum, to form a cast multilayer film. The layers of the cast film are typically all isotropic. After the multilayer web is cooled on the chill roll, it can be drawn or stretched to orient the film such that at least some of the layers become birefringent.

In some embodiments, the plurality of alternating polymeric layers includes alternating first and second polymeric layers, where the first polymeric layers are substantially uniaxially oriented which can be understood to mean that the refractive index in a first in-plane direction and the thickness direction are within 0.02 of each other and an absolute difference of the refractive index in an orthogonal second in-plane direction and the first in-plane direction is at least 0.05. In some embodiments, the second polymeric layers are substantially isotopic. Substantially isotropic can be understood to mean that the refractive index in each of 3 mutually orthogonal directions are within 0.02 of each other. In some embodiments, the reflective polarizer has at least one layer having indices of refraction in a length direction and a thickness direction that are substantially the same (e.g., within 0.02 or within 0.01), but substantially different from an index of refraction in a width direction (e.g., difference of at least 0.05, or at least 0.1 or at least 0.15). Such substantially uniaxially oriented multilayer optical films are described in U.S. Pat. Appl. No. 2010/0254002 (Merrill et al.), for example, and can be made by using a parabolic tenter, for example, to orient a multilayer film.

In some embodiments, the optical repeat units have an optical thickness that varies substantially continuously to provide a reflection band. The thickness variation may be chosen to provide sharpened band edges as described in U.S. Pat. No. 6,157,490 (Wheatley et al.), for example, or may be chosen to provide a more gradual transition from high to low reflectivity. A sharpened band edge may have a best linear fit having a slope that is greater than about 7%/nm, or greater than about 10%/nm, for example, as described further elsewhere herein.

Figure 2:
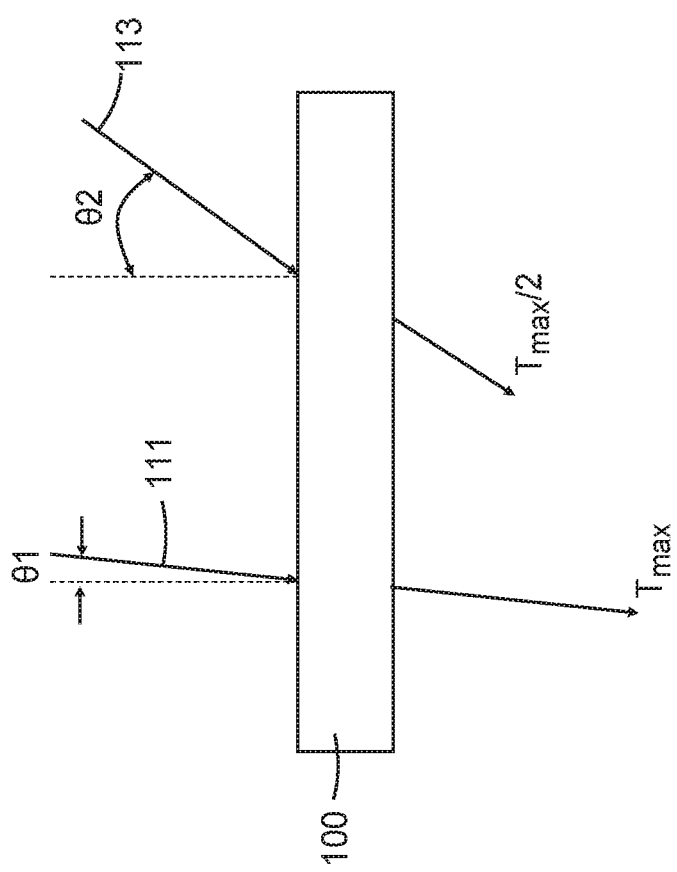
FIG. 2 is a schematic cross-sectional view of a reflective polarizer illustrating light incident on the reflective polarizer at different angles of incidence.

In some embodiments, the reflective polarizer is a collimating reflective polarizer. A collimating reflective polarizer has a higher optical transmittance for light closer to normally incident and a lower optical transmittance (higher reflectance) of light farther from normally incident. The dependence of the transmittance on the angle of incidence can be tailored by tailoring the refractive index differences between adjacent layers in the x-, y-, and z-directions (e.g., by selecting the difference in refractive index in the z-direction to control the incidence angle dependence of p-polarization transmittance) and/or by tailoring the thickness profile of the layers (e.g., using apodized thickness profiles) as described in U.S. Pat. No. 9,551,818 (Weber et al.); U.S. Pat. No. 9,322,967 (Weber et al.); and U.S. Pat. No. 9,441,809 (Nevitt et al.), for example. In some embodiments, as schematically illustrated in FIG. 2, for at least one wavelength (e.g., for a blue wavelength $\lambda_b$), the reflective polarizer 100 has a maximum optical transmittance $T_{max}$ for light 111 incident at a first incident angle 74 1, and an optical transmittance $T_{max}/2$ for light 113 incident at a second incident angle greater than the first incident angle by less than about 50 degrees (i.e., $\theta 1 < \theta 2 < \theta 1$ plus about 50 degrees). In some embodiments, $\theta 1 < \theta 2 < \theta 1 + 50$ degrees, or $\theta 1 < \theta 2 < \theta 1 + 40$ degrees. In some embodiments, $\theta 1$ is about zero (e.g., less than about 10 degrees or less than about 5 degrees). The incident angles are measured relative to a normal to the reflective polarizer. In some embodiments, the light 111 and the light 113 each have the second (pass) polarization state. The ratio of the transmittance at the angle of incidence $\theta 1$ to the transmittance at the angle of incidence $\theta 2$ may be about the same for light having the second polarization state as for unpolarized light since the transmittance of the portion of the unpolarized light in the block state may be negligible.

Figure 3:
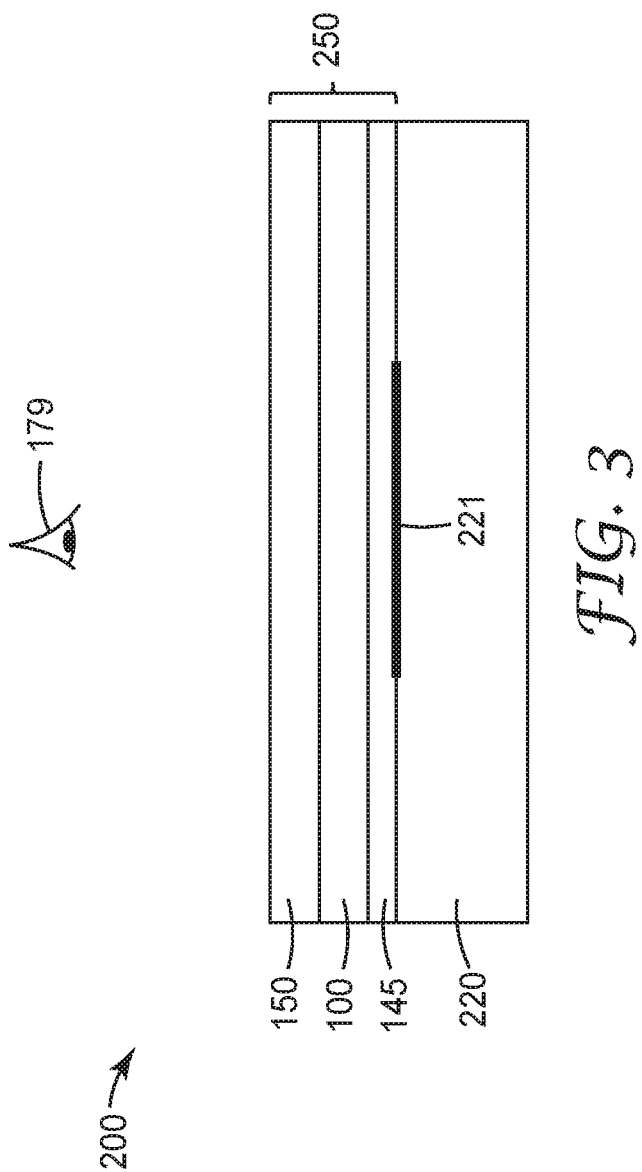
FIG. 3 is a schematic cross-sectional view of an optical system.

FIG. 3 is a schematic cross-sectional view of an optical system 200 (which may also be referred to as a display system) including an emissive display 220 configured to emit an image 221 (e.g., for viewing by a viewer 179). The optical system 200 includes a linear absorbing polarizer 150 disposed on the display 220 and a reflective polarizer 100 disposed between the linear absorbing polarizer 150 and the display 220. In the illustrated embodiments, the optical system 200 further includes a retarder or retarder layer 145 disposed between the reflective polarizer 100 and display 220. In some embodiments, a circular polarizer 250 includes the reflective polarizer 100, the linear absorbing polarizer 150, and the retarder 145, where the reflective polarizer 100 is disposed between the linear absorbing polarizer 150 and the retarder 145. In some embodiments, a display system 200 includes an emissive display 220 and the circular polarizer 250 disposed on the emissive display 220 such that the retarder 145 faces the emissive display 220. The reflective polarizer 100 included in the display system or optical system 200 may be any reflective polarizer described herein. For example, the reflective polarizer 100 may be a multi-layer polymeric reflective polarizer and/or may include a plurality of alternating first and second polymeric layers 102a and 102b, where an average thickness of each first and second polymeric layer is less than about 400 nm. The linear absorbing polarizer 150 and the reflective polarizer 100 may have pass axes substantially aligned with one another (e.g., aligned to within 20 degrees, or to within 10 degrees, or to within 5 degrees). The emissive display 220 can be an OLED display, for example. Other displays where a reflective polarizer can be advantageously placed between the display and the viewer may also be utilized.

In some embodiments, the retarder 145 is a quarter wave retarder for at least one wavelength in a visible wavelength range (e.g., for at least one wavelength in the range of 400 nm to 700 nm). The retarder 145 may have a fast axis aligned at about 45 degrees to the pass axis of the reflective polarizer 100 and/or the linear absorbing polarizer 150. In some embodiments, the retarder 145 includes a plurality of layers (e.g., a ½ wave retarder layer and a ¼ wave retarder layer oriented with the fast axes rotated relative to one another). Retardances other than quarter wave (e.g., 5/4 of a wavelength) may also be used. Suitable retarders are known in the art and include birefringent polymer film retarders such as those available from Meadowlark Optics (Frederick, CO) and achromatic retarders such as those available from ROLIC Technologies Ltd. (Allschwil, Switzerland). Useful retarders are described in International Pat. Appl. Publ. No. WO 2018/178817 (Steiner et al.), for example.

The layers 150 and/or 145 may optionally be omitted from the optical system 200. However, it is often preferred to include these layers in OLED devices, for example, in order to reduce reflection of ambient light from the optical system 200.

Figure 4:
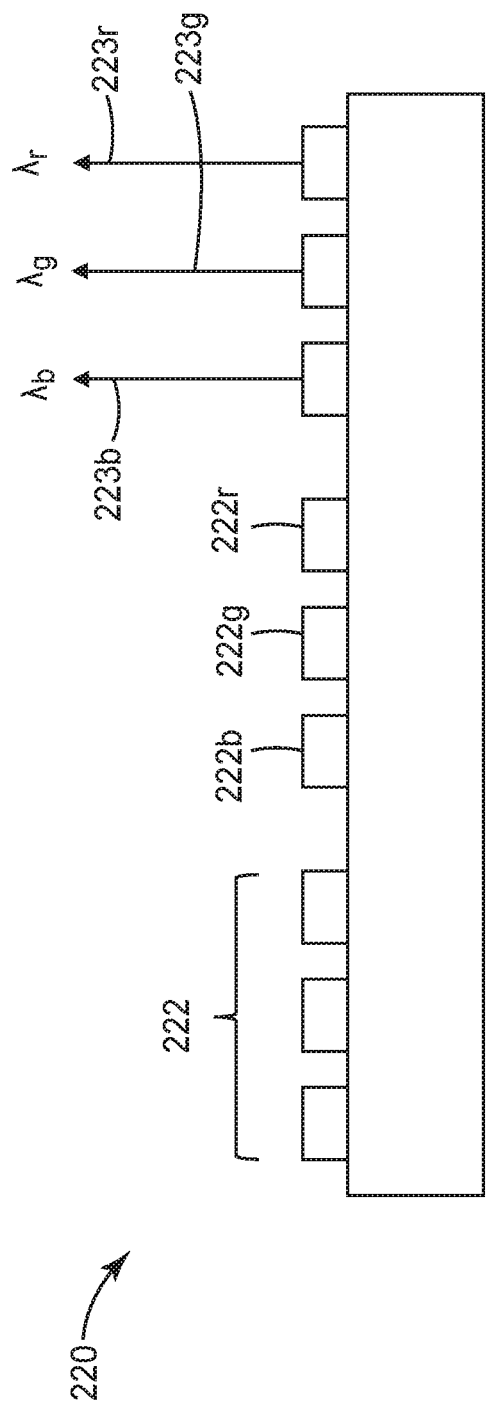
FIG. 4 is a schematic cross-sectional view of an emissive display.

FIG. 4 is a schematic illustration of an emissive display 220 including a plurality of groups of pixels 222. In the illustrated embodiments, each group of pixels 222 includes a blue pixel 222b, a green pixel 222g, and a red pixel 222r. In other embodiments, fewer pixels may be included or more pixels may be included in each group. For example, two green pixels may be included in each group of pixels 222. As another example, each group of pixels 222 may further include a white pixel. In some embodiments, the blue pixel 222b is configured to emit blue light 223b having a blue peak at a blue wavelength $\lambda_b$. In some embodiments, the green pixel 222g is configured to emit green light 223g having a green peak at a green wavelength $\lambda_g$. In some embodiments, the red pixel is configured to emit red light 223r having a red peak at a red wavelength $\lambda_r$.

Figure 5:
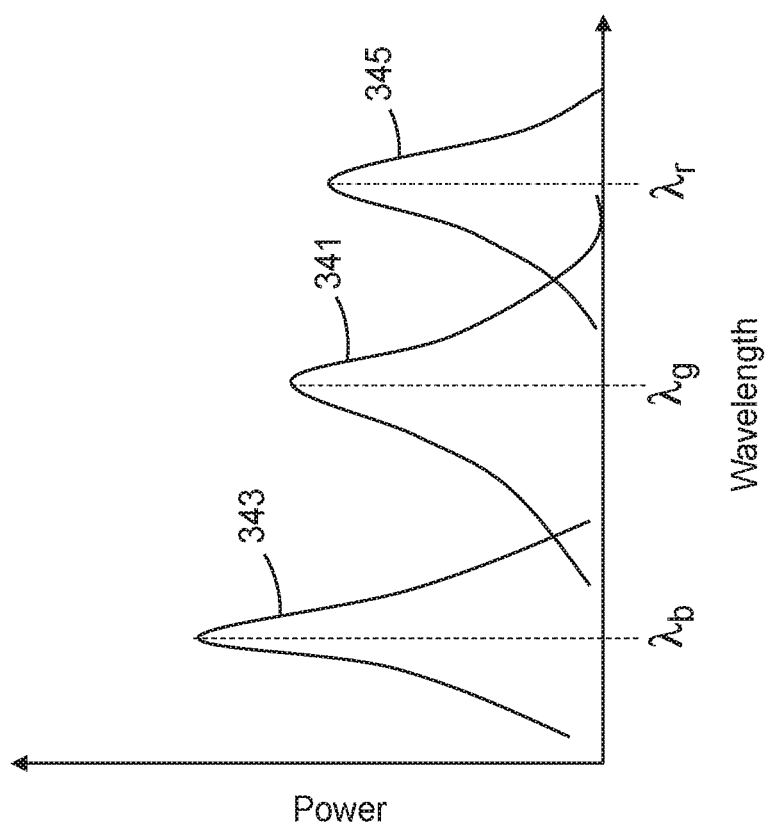
FIG. 5 is a schematic plot of emission spectra of various pixels.

FIG. 5 is a schematic illustration of emission spectra of various pixels. The emission spectrum 341 of a green pixel, the emission spectrum 343 of a blue pixel, and the emission spectrum 345 of a red pixel are schematically illustrated. The peak emission wavelengths $\lambda_b$, $\lambda_g$, and $\lambda_r$, of the blue, green, and red pixels, respectively, are shown.

In some embodiments, the emissive display 220 is configured to emit an image in a visible wavelength range extending at least from about 430 nm to about 640 nm, or at least from about 420 nm to about 650 nm. In some embodiments, for substantially normally incident light and for each wavelength in the visible wavelength range, the reflective polarizer 100 transmits at least 60%, or at least 70%, or at least 75%, or at least 80%, of the incident light having the second polarization state. In some embodiments, the blue wavelength $\lambda_b$ is in a range from about 420 nm to about 480 nm. In some embodiments, the green wavelength $\lambda_g$ is in a range from about 510 nm to about 580 nm. In some embodiments, the red wavelength $\lambda_r$ is in a range from about 590 nm to about 650 nm.

FIGS. 6A-6B schematically illustrate optical reflectance versus wavelength for a reflective polarizer for substantially normally incident (e.g., within 10 degrees or within 5 degrees of normally incident) light in a first (block) polarization state and a second (pass) polarization state, respectively. In some embodiments, the optical transmittance T is about 100% minus the optical reflectance R.

The reflective polarizer may have a reflectance in the blue selected to provide a desired blue recycling while limiting the added ambient reflection from the display in the blue. In some embodiments, the reflectance of the reflective polarizer in the blue may be high (e.g., at least 70%, or at least 80%, or at least 90%) to provide a high degree of recycling. In some embodiments, the reflectance in the blue may be limited (e.g., no more than 80%, or no more than 70%, or no more than 60%, or no more than 50%) so that the reflective polarizer does not add undesired ambient reflection in the blue. In some embodiments, for substantially normally incident light: for the blue wavelength $\lambda_b$, the reflective polarizer reflects at least 25%, or at least 30%, or at least 35%, or at least 40%, or at least 45%, or at least 50% of the incident light having a first polarization state. In some embodiments, for substantially normally incident light: for the blue wavelength $\lambda_b$, the reflective polarizer transmits at least 50%, or at least 55%, or at least 60%, or at least 65%, or at least 70%, or at least 75%, or at least 80% of the incident light having a second polarization state orthogonal to the first polarization state. In some embodiments, for substantially normally incident light: for the blue wavelength $\lambda_b$, the reflective polarizer reflects at least 30% of the incident light having a first polarization state and, in some embodiments, transmits at least 75% of the incident light having an orthogonal second polarization state. In some embodiments, for substantially normally incident light: for the blue wavelength $\lambda_b$, the reflective polarizer reflects at least 40% of the incident light having a first polarization state and, in some embodiments, transmits at least 65% of the incident light having an orthogonal second polarization state. In some embodiments, for substantially normally incident light: for the blue wavelength $\lambda_b$, the reflective polarizer reflects at least 50% of the incident light having a first polarization state and, in some embodiments, transmits at least 55% of the incident light having an orthogonal second polarization state. In some embodiments, for substantially normally incident light and for the blue wavelength $\lambda_b$, the reflective polarizer reflects greater than 50% of the incident light having the first polarization state and transmits greater than 50% of the incident light having the orthogonal second polarization state. In some embodiments, for substantially normally incident light and for the blue wavelength $\lambda_b$, the reflective polarizer reflects at least 60% of the incident light having the first polarization state and transmits at least 60% of the incident light having the orthogonal second polarization state. In some embodiments, for substantially normally incident light and for the blue wavelength $\lambda_b$, the reflective polarizer reflects at least 70% of the incident light having the first polarization state and transmits at least 70% of the incident light having the orthogonal second polarization state. In some embodiments, for substantially normally incident light and for the blue wavelength $\lambda_b$, the reflective polarizer reflects at least 80% of the incident light having the first polarization state and transmits at least 80% of the incident light having the orthogonal second polarization state. In some embodiments, for substantially normally incident light and for the blue wavelength $\lambda_b$, the reflective polarizer transmits at least 20%, or at least 30%, of the incident light having the first polarization state.

The reflective polarizer may have an average transmittance for substantially normally incident light in the visible wavelength range over which the emissive display is configured to emit an image (e.g., at least from about 430 nm to about 640 nm, or at least from about 420 nm to about 650 nm) of at least 20% or at least 30% for the first (block) polarization state. In some embodiments, for substantially normally incident light, the reflective polarizer transmits at least 20%, or at least 30%, of the incident light having the first polarization state. In some embodiments, for a substantially normally incident light and for each wavelength in the visible wavelength range, the reflective polarizer transmits at least 70%, or at least 75%, or at least 80%, of the incident light having the second polarization state.

In some embodiments, in addition to or instead of limiting the reflectance in the blue, the reflective polarizer has a sharp transition between reflectance in the blue and transmittance for longer wavelengths. This can be done to limit the range of wavelength reflected by the reflective polarizer which can reduce the ambient reflection from the display system including the reflective polarizer. In some embodiments, for substantially normally incident light and for at least one wavelength $\lambda_1$ greater than $\lambda_b$, $\lambda_1-\lambda_b \leq 100$ nm or $\lambda_1-\lambda_b \leq 50$ nm, the reflective polarizer transmits at least 40% of the incident light for each of the first and second polarization states. In some embodiments, for substantially normally incident light and for at least one wavelength $\lambda_1$ greater than $\lambda_b$, $\lambda_1-\lambda_b \leq 100$ nm or $\lambda_1-\lambda_b \leq 50$ nm, the reflective polarizer transmits at least 50% of the incident light for each of the first and second polarization states. In some embodiments, for substantially normally incident light and for at least one wavelength $\lambda_1$ greater than $\lambda_b$, $\lambda_1-\lambda_b \leq 100$ nm or $\lambda_1-\lambda_b \leq 50$ nm, the reflective polarizer transmits at least 60% of the incident light for each of the first and second polarization states. In some embodiments, for substantially normally incident light and for at least one wavelength $\lambda_1$ greater than $\lambda_b$, $\lambda_1-\lambda_b \leq 100$ nm or $\lambda_1-\lambda_b \leq 50$ nm, the reflective polarizer transmits at least 70% of the incident light for each of the first and second polarization states. In some embodiments, for substantially normally incident light and for at least one wavelength $\lambda_1$ greater than $\lambda_b$, $\lambda_1-\lambda_b \leq 100$ nm or $\lambda_1-\lambda_b \leq 50$ nm, the reflective polarizer transmits at least 75% of the incident light for each of the first and second polarization states. In some embodiments, for substantially normally incident light and for at least one wavelength $\lambda_1$ greater than $\lambda_b$, $\lambda_1-\lambda_b \leq 100$ nm or $\lambda_1-\lambda_b \leq 50$ nm, the reflective polarizer transmits at least 80% of the incident light for each of the first and second polarization states.

In some embodiments, there is a sharp transition between transmission and reflection at the left of the blue reflection band instead of, or in addition to, a sharp transition between reflectance in the blue and transmittance for longer wavelengths. In some embodiments, for a substantially normally incident light and for at least one wavelength $\lambda_{uv}$ less than $\lambda_b$, $\lambda_b-\lambda_{uv} \leq 100$ nm, the reflective polarizer transmits at least 40%, or at least 50%, or at least 60%, or at least 70%, or at least 75% of the incident light for each of the first and second polarization states. $\lambda_{uv}$ may be an ultraviolet wavelength or may be a blue wavelength less than $\lambda_b$. In some embodiments, for at least one wavelength $\lambda_{uv}$ less than $\lambda_b$, $\lambda_b-\lambda_{uv} \leq 100$ nm, and at least one wavelength $\lambda_1$ greater than $\lambda_b$, $\lambda_1-\lambda_b \leq 100$ nm, the reflective polarizer transmits at least 40%, or at least 50%, or at least 60%, or at least 70%, or at least 75% of the incident light for each of the first and second polarization states. In some embodiments, $\lambda_b-\lambda_{uv} \leq 50$ nm. In some embodiments, for at least one wavelength $\lambda_{uv}$ less than $\lambda_b$, $\lambda_b-\lambda_{uv} \leq 50$ nm, and at least one wavelength $\lambda_1$ greater than $\lambda_b$, $\lambda_1 - \lambda_b \leq 50$ nm, the reflective polarizer transmits at least 40%, or at least 50%, or at least 60%, or at least 70%, or at least 75% of the incident light for each of the first and second polarization states. Including a sharp transition between transmission and reflection at the left of the blue reflection band can be advantageous in some cases since this can reduce ambient reflection of low wavelength (less than $\lambda_b$) blue light while providing desired reflection of blue light having wavelengths near $\lambda_b$.

In some embodiments of the optical system 200, for the wavelength $\lambda_b$, the reflective polarizer 100 has a maximum optical transmittance $T_{max}$ for light incident at a first incident angle $\theta 1$, and an optical transmittance $T_{max}/2$ for light incident at a second incident angle $\theta 2$ greater than the first incident angle by less than about 50 degrees (see, e.g., FIG. 2). In some embodiments, the first incident angle is about zero (e.g., within 10 degrees or within 5 degrees of zero degrees).

In some embodiments, the reflectance of the reflective polarizer for green and/or red wavelengths at normal incidence is limited. In some embodiments, for a substantially normally incident light and for the wavelength $\lambda_r$, the reflective polarizer reflects at most 40%, or at most 30%, or at most 20%, of the incident light having the first polarization state. In some embodiments, for a substantially normally incident light and for each of the green and red wavelengths $\lambda_g$ and $\lambda_r$, the reflective polarizer transmits at least 40%, or at least 50%, or at least 60%, or at least 70%, or at least 75%, or at least 80%, of the incident light for the first polarization state. In some embodiments, for a substantially normally incident light and for each of the green and red wavelengths $\lambda_g$ and $\lambda_r$, the reflective polarizer transmits at least 40%, or at least 50%, or at least 60%, or at least 70%, or at least 75%, or at least 80%, of the incident light for each of the first and second polarization states.

Figure 7A:
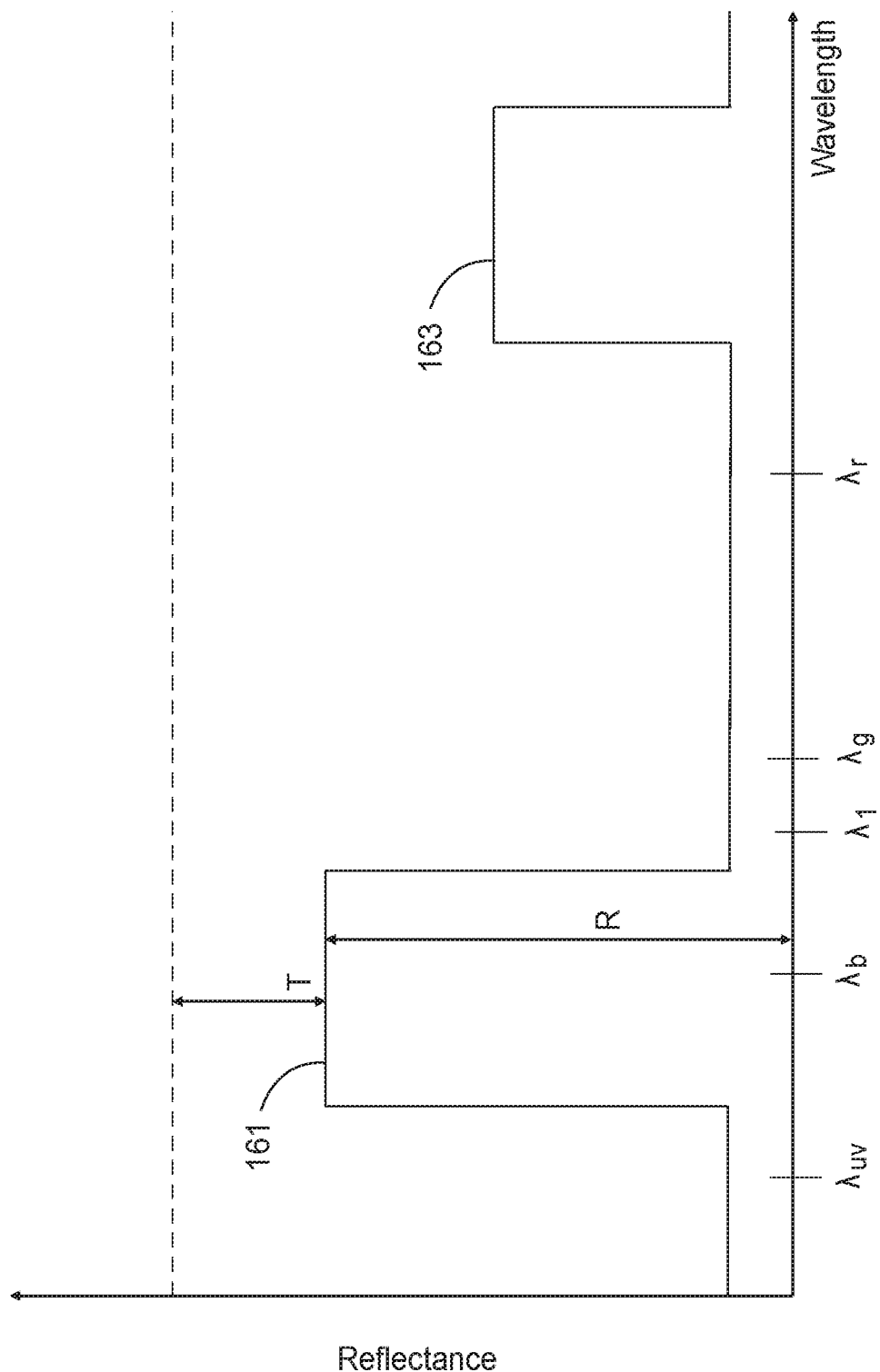
FIGS. 7A-7B are schematic plots of the optical reflectance of a reflective polarizer versus wavelength for a block polarization state for substantially normally incident light and for light incident at an incident angle greater than about 20 degrees, respectively.
Figure 7B:
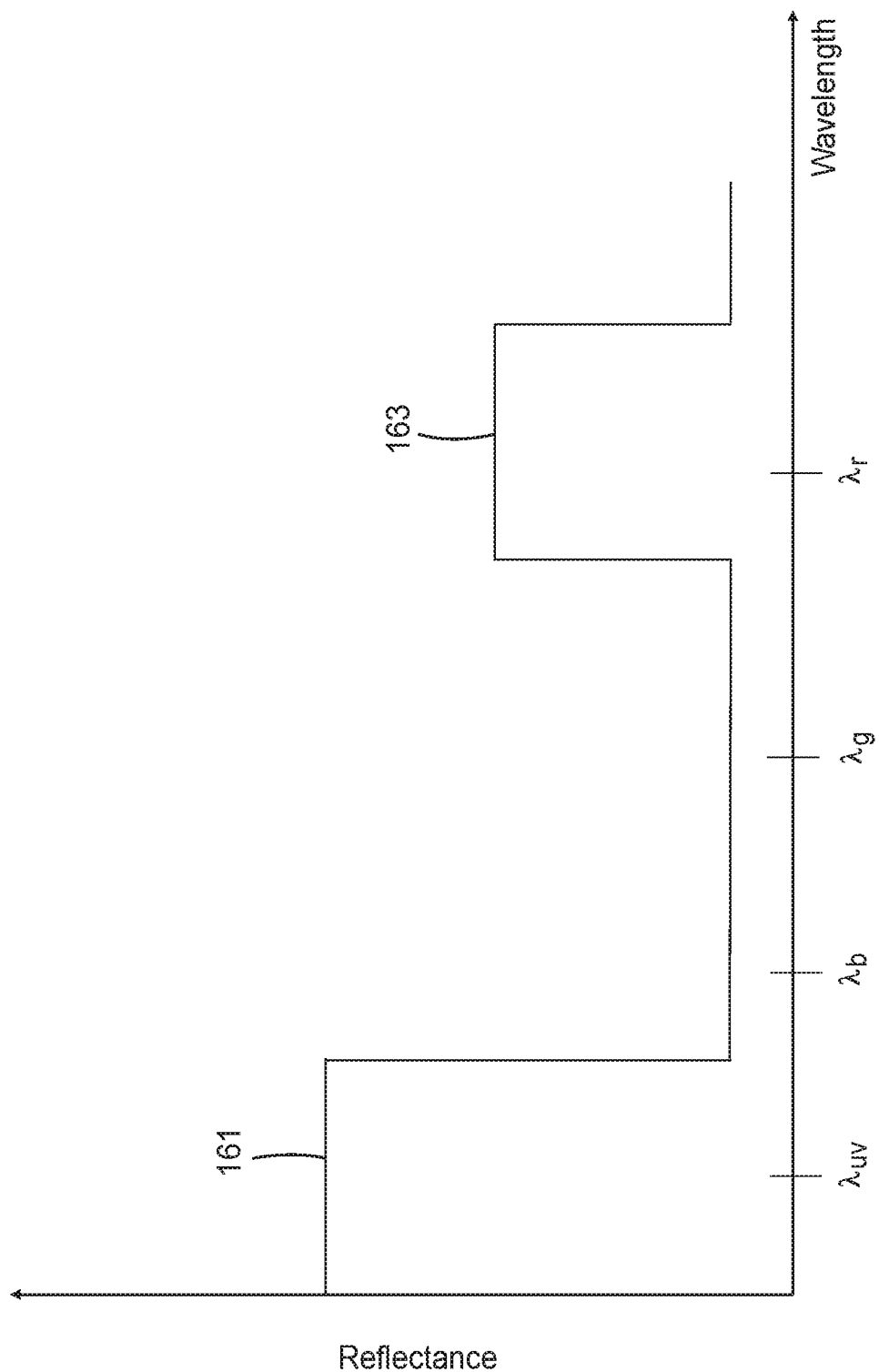

FIGS. 7A-7B schematically illustrate the optical reflectance of a reflective polarizer versus wavelength for the first polarization state for substantially normally incident light and for light incident at an incident angle greater than about 20 degrees, respectively. In the illustrated embodiment, the reflective polarizer has a blue reflection band 161 and a near infrared reflection band 163 at normal incidence. The reflection bands of the reflective polarizer generally shift to lower wavelength as the angle of incidence increases. In some embodiments, the near infrared reflection band 163 shifts into visible wavelengths at increased angles of incidence. In some embodiments, for a substantially normally incident light having a red wavelengths $\lambda_r$, the reflective polarizer transmits at least 40% (or at least 50% or at least 60% or at least 70% or at least 75%) of the incident light for each of the first and second polarization states; and for a light having a red wavelength $\lambda_r$ and incident at an incident angle greater than about 20 degrees, the reflective polarizer reflects at least 50% of light having the first polarization state and transmits at least 50% of light having the second polarization state. In some embodiments, for the light having the red wavelength $\lambda_r$ and incident at the incident angle greater than about 20 degrees, the reflective polarizer reflects at least 60% of light having the first polarization state and transmits at least 60% of light having the second polarization state. In some embodiments, for the light having the red wavelength $\lambda_r$ and incident at the incident angle greater than about 20 degrees, the reflective polarizer reflects at least 70% of light having the first polarization state and transmits at least 70% of light having the second polarization state. In some embodiments, for the light having the red wavelength $\lambda_r$ and incident at the incident angle greater than about 20 degrees, the reflective polarizer reflects at least 30% of light having the first polarization state and transmits at least 75% of light having the second polarization state. In some embodiments, for the light having the red wavelength $\lambda_r$ and incident at the incident angle greater than about 20 degrees, the reflective polarizer reflects at least 40% of light having the first polarization state and transmits at least 65% of light having the second polarization state. The incident angle greater than about 20 degrees may be in a range of about 30 degrees to about 60 degrees, for example.

FIG. 8 is a schematic plot of the optical transmittance of a reflective polarizer versus wavelength for the first polarization state (block state). The sharpness of the band edge can be characterized by the slope of a line fit (e.g., a linear least squares fit) to the band edge. In some embodiments, for a substantially normally incident light and for the first polarization state, an optical transmittance of the reflective polarizer includes a band edge 125 at least a portion of which is disposed in a visible wavelength range, such that a best linear fit 136 to the band edge 125 correlating the optical transmittance to wavelength at least across a wavelength range where the optical transmittance increases from about 20% of a maximum transmittance Tm of the reflective polarizer in the visible wavelength range to about 70% of the maximum transmittance Tm of the reflective polarizer in the visible wavelength range has a slope that is greater than about 7%/nm, or greater than about 10%/nm.

In some embodiments, the band edge 125 separates first and second wavelength ranges 124 and 126 where at least a portion of each of the first and second wavelength ranges 124 and 126 is disposed in a visible wavelength range. In some embodiments, for at least one wavelength $\lambda_b$ (e.g., a blue wavelength) in the first wavelength range 124, the reflective polarizer reflects at least 70%, or at least 75%, or at least 80%, of the incident light having a first polarization state. In some embodiments, for each wavelength in the second wavelength range 126, the reflective polarizer transmits at least 60%, or at least 70%, or at least 75%, or at least 80%, of the incident light having the first polarization state. In some embodiments, for each wavelength in the first and second wavelength ranges 124 and 126, the reflective polarizer transmits at least 60%, or at least 70%, or at least 75%, or at least 80%, of the incident light having the second polarization state. In some embodiments, the reflective polarizer has a maximum transmittance Tm in the first and second wavelength ranges for the first polarization state. In some embodiments, the wavelength range where the optical transmittance increases from about 20% of the maximum transmittance to about 70% of the maximum transmittance is disposed between the blue wavelength $\lambda_b$ and the green wavelength $\lambda_g$. For example, $\lambda_b$ may be in the first wavelength range 124 and $\lambda_g$ may be in the second wavelength range 126 as schematically illustrated in FIG. 8.

The following is a list of illustrative embodiments of the present description.

A first embodiment is an optical system comprising:

an emissive display configured to emit an image and comprising a blue pixel configured to emit a blue light, the emitted blue light having a blue peak at a blue wavelength $\lambda_b$;

a linear absorbing polarizer layer disposed on the display; and a reflective polarizer disposed between the linear absorbing polarizer layer and the display and configured to receive the image emitted by the display, for substantially normally incident light:

for the blue wavelength $\lambda_b$, the reflective polarizer reflects at least 30% of the incident light having a first polarization state and transmits at least 75% of the incident light having an orthogonal second polarization state; and for at least one wavelength $\lambda_1$ greater than $\lambda_b$, $\lambda_1-\lambda_b \leq 50$ nm, the reflective polarizer transmits at least 60%, or at least 70%, or at least 75%, or at least 80% of the incident light for each of the first and second polarization states; and for the blue wavelength $\lambda_b$, the reflective polarizer has a maximum optical transmittance $T_{max}$ for light incident at a first incident angle, and an optical transmittance $T_{max}/2$ for light incident at a second incident angle greater than the first incident angle by less than about 50 degrees.

A second embodiment is the optical system of the first embodiment, wherein the emissive display is configured to emit an image in a visible wavelength range extending at least from about 420 nm to about 650 nm, wherein for a substantially normally incident light and for the first polarization state, an optical transmittance of the reflective polarizer comprises a band edge at least a portion of which is disposed in the visible wavelength range, such that a best linear fit to the band edge correlating the optical transmittance to wavelength at least across a wavelength range where the optical transmittance increases from about 20% of a maximum transmittance of the reflective polarizer in the visible wavelength range to about 70% of the maximum transmittance of the reflective polarizer in the visible wavelength range has a slope that is greater than about 7%/nm. A third embodiment is the optical system of the first or second embodiments, wherein the first incident angle is about zero.

A fourth embodiment is the optical system of any one of the first through third embodiments, wherein for a substantially normally incident light having a red wavelengths $\lambda_r$, the reflective polarizer transmits at least 40% of the incident light for each of the first and second polarization states; and for a light having a red wavelength $\lambda_r$ and incident at an incident angle greater than about 20 degrees, the reflective polarizer reflects at least 50% of light having the first polarization state and transmits at least 50% of light having the second polarization state.

A fifth embodiment is a display system comprising:
an emissive display configured to emit an image for viewing by a viewer, the emissive display comprising a blue pixel configured to emit blue light having a blue peak at a blue wavelength $\lambda_b$, a green pixel configured to emit green light having a green peak at a green wavelength $\lambda_g$, and a red pixel configured to emit red light having a red peak at a red wavelength $\lambda_r$;
a reflective polarizer disposed on the emissive display, such that for a substantially normally incident light:
for the blue wavelength $\lambda_b$, the reflective polarizer reflects at least 60% of light having a first polarization state and transmits at least 60% of light having an orthogonal second polarization state; and
for each of the green and red wavelengths $\lambda_g$ and $\lambda_r$, the reflective polarizer transmits at least 40% of the incident light for each of the first and second polarization states; and
for a light having the red wavelength and incident at an incident angle greater than about 20 degrees, the reflective polarizer reflects at least 50% of light having the first polarization state and transmits at least 50% of light having the second polarization state.

A sixth embodiment is the display system of the fifth embodiment, wherein for a substantially normally incident light and for the first polarization state, an optical transmittance of the reflective polarizer comprises a band edge at least a portion of which is disposed in a visible wavelength range, such that a best linear fit to the band edge correlating the optical transmittance to wavelength at least across a wavelength range where the optical transmittance increases from about 20% of a maximum transmittance of the reflective polarizer in the visible wavelength range to about 70% of the maximum transmittance of the reflective polarizer in the visible wavelength range has a slope that is greater than about 7%/nm, wherein the wavelength range where the optical transmittance increases from about 20% of the maximum transmittance to about 70% of the maximum transmittance is disposed between the blue wavelength $\lambda_b$ and the green wavelength $\lambda_g$.

A seventh embodiment is the display system of the fourth or fifth embodiments, wherein for a substantially normally incident light and for each of the green and red wavelengths $\lambda_g$ and $\lambda_r$, the reflective polarizer transmits at least 60%, of the incident light for each of the first and second polarization states.

An eighth embodiment is an optical system comprising:
an emissive display configured to emit an image in a visible wavelength range extending at least from about 430 nm to about 640 nm, the emissive display comprising a blue pixel configured to emit a blue light having a blue peak at a blue wavelength $\lambda_b$, a green pixel configured to emit a green light having a green peak at a green wavelength $\lambda_g$, and a red pixel configured to emit a red light having a red peak at a red wavelength $\lambda_r$; and
a reflective polarizer disposed on the display, such that for a substantially normally incident light:
for the wavelength $\lambda_b$, the reflective polarizer reflects at least 30% of the incident light having a first polarization state and transmits at least 75% of the incident light having a second polarization state orthogonal to the first polarization state;
for the wavelength $\lambda_r$, the reflective polarizer reflects at most 40% of the incident light having the first polarization state;
for each wavelength in the visible wavelength range, the reflective polarizer transmits at least 60% of the incident light having the second polarization state; and
for at least one wavelength $\lambda_{uv}$ less than $\lambda_b$, $\lambda_b-\lambda_{uv} \leq 100$ nm, the reflective polarizer transmits at least 40%, or at least 50%, or at least 60%, or at least 70%, or at least 75%, or at least 80% of the incident light for each of the first and second polarization states.

A ninth embodiment is the optical system of the eighth embodiment, wherein for a substantially normally incident light and for the blue wavelength $\lambda_b$, the reflective polarizer transmits at least 20% of the incident light having the first polarization state.

A tenth embodiment is the optical system of the eighth or ninth embodiments, wherein $\lambda_b-\lambda_{uv} \leq 50$ nm.

An eleventh embodiment is an optical system comprising:
an emissive display configured to emit an image in a visible wavelength range, the display comprising a blue pixel configured to emit a blue light having a blue peak at a blue wavelength $\lambda_b$, a green pixel configured to emit a green light having a green peak at a green wavelength $\lambda_g$, and a red pixel configured to emit a red light having a red peak at a red wavelength $\lambda_r$; and
a reflective polarizer disposed on the display, such that for a substantially normally incident light:

for the wavelength $\lambda_b$, the reflective polarizer reflects at least 60% of the incident light having a first polarization state;

for each of the wavelengths $\lambda_g$ and $\lambda_r$, the reflective polarizer transmits at least 60% of the incident light having the first polarization state;

for each wavelength in the visible wavelength range, the reflective polarizer transmits at least 60% of the incident light having a second polarization state orthogonal to the first polarization state; and for the first polarization state, an optical transmittance of the reflective polarizer comprises a band edge at least a portion of which is disposed in the visible wavelength range, such that a best linear fit to the band edge correlating the optical transmittance to wavelength at least across a wavelength range where the optical transmittance increases from about 20% of a maximum transmittance of the reflective polarizer in the visible wavelength range to about 70% of the maximum transmittance of the reflective polarizer in the visible wavelength range has a slope that is greater than about 7%/nm.

A twelfth embodiment is the optical system of the eleventh embodiment, wherein the slope is greater than about 10%/nm.

A thirteenth embodiment is a multilayer polymeric reflective polarizer comprising a plurality of alternating first and second polymeric layers, an average thickness of each layer less than about 400 nm, such that for a substantially normally incident light:

an optical transmittance of the reflective polarizer for a first polarization state comprises a band edge separating first and second wavelength ranges, at least a portion of each of the first and second wavelength ranges disposed in a visible wavelength range;

for at least one wavelength $\lambda_b$ in the first wavelength range, the reflective polarizer reflects at least 70% of the incident light having the first polarization state;

for each wavelength in the second wavelength range, the reflective polarizer transmits at least 60% of the incident light having the first polarization state;

for each wavelength in the first and second wavelength ranges, the reflective polarizer transmits at least 60% of the incident light having a second polarization state orthogonal to the first polarization state;

the reflective polarizer has a maximum transmittance in the first and second wavelength ranges for the first polarization state; and a best linear fit to the band edge correlating the optical transmittance to wavelength at least across a wavelength range where the optical transmittance increases from about 20% of the maximum transmittance to about 70% of the maximum transmittance has a slope that is greater than about 7%/nm.

A fourteenth embodiment is the multilayer polymeric reflective polarizer of the thirteenth embodiment, wherein for at least one wavelength $\lambda_{uv}$ less than $\lambda_b$, $\lambda_b-\lambda_{uv} \leq 100$ nm, and at least one wavelength $\lambda_1$ greater than $\lambda_b$, $\lambda_1-\lambda_b \leq 100$ nm, the reflective polarizer transmits at least 40% of the incident light for each of the first and second polarization states.

A fifteenth embodiment is the multilayer polymeric reflective polarizer of the thirteenth embodiment, wherein for at least one wavelength $\lambda_{uv}$ less than $\lambda_b$, $\lambda_b-\lambda_{uv} \leq 50$ nm, and at least one wavelength $\lambda_1$ greater than $\lambda_b$, $\lambda_1-\lambda_b \leq 50$ nm, the reflective polarizer transmits at least 40% of the incident light for each of the first and second polarization states.

EXAMPLES

Examples 1-4

Reflective polarizer films were prepared as follows: A single multilayer optical packet was co-extruded. The packet has a total of 183 alternating layers of 90/10 coPEN, a polymer composed of 90% polyethylene naphthalate (PEN) and 10% polyethylene terephthalate (PET), and a low index isotropic layer, which was made with a blend of polycarbonate and copolyesters (PC:coPET) such that the index was about 1.57 and such that the isotropic layer remained substantially isotropic upon uniaxial orientation of the film. The PC:coPET molar ratio was approximately 42.5 mol % PC and 57.5 mol % coPET and had a Tg of 105 degrees centigrade. This isotropic material was chosen such that after stretching its refractive indices in the two non-stretch directions remained substantially matched with those of the birefringent material in the non-stretching direction while in the stretching direction there was a substantial mis-match in refractive indices between birefringent and non-birefringent layers. The 90/10 PEN and PC:coPET polymers were fed from separate extruders at a target f-ratio of approximately 0.5 to a multilayer coextrusion feedblock, in which they were assembled into a packet of 183 alternating optical layers, plus a thicker protective boundary layer of the PC:coPET, on each side, for a total of 185 layers. The thickness profile of the layers of the films were chosen such that the films would produce the transmission spectra shown in FIG. 9 after uniaxial orientation. The multilayer melt was then cast through a film die onto a chill roll, in the conventional manner for polyester films, upon which it was quenched. The cast web was then stretched in a parabolic tenter similar to that described in the Invited Paper 45.1, authored by Denker et al., entitled "Advanced Polarizer Film for Improved Performance of Liquid Crystal Displays," presented at Society for Information Displays (SID) International Conference in San Francisco, Calif., Jun. 4-9, 2006. This film had a resulting physical thickness as measured by a capacitance gauge of approximately 12.8 micrometers.

Figure 9:
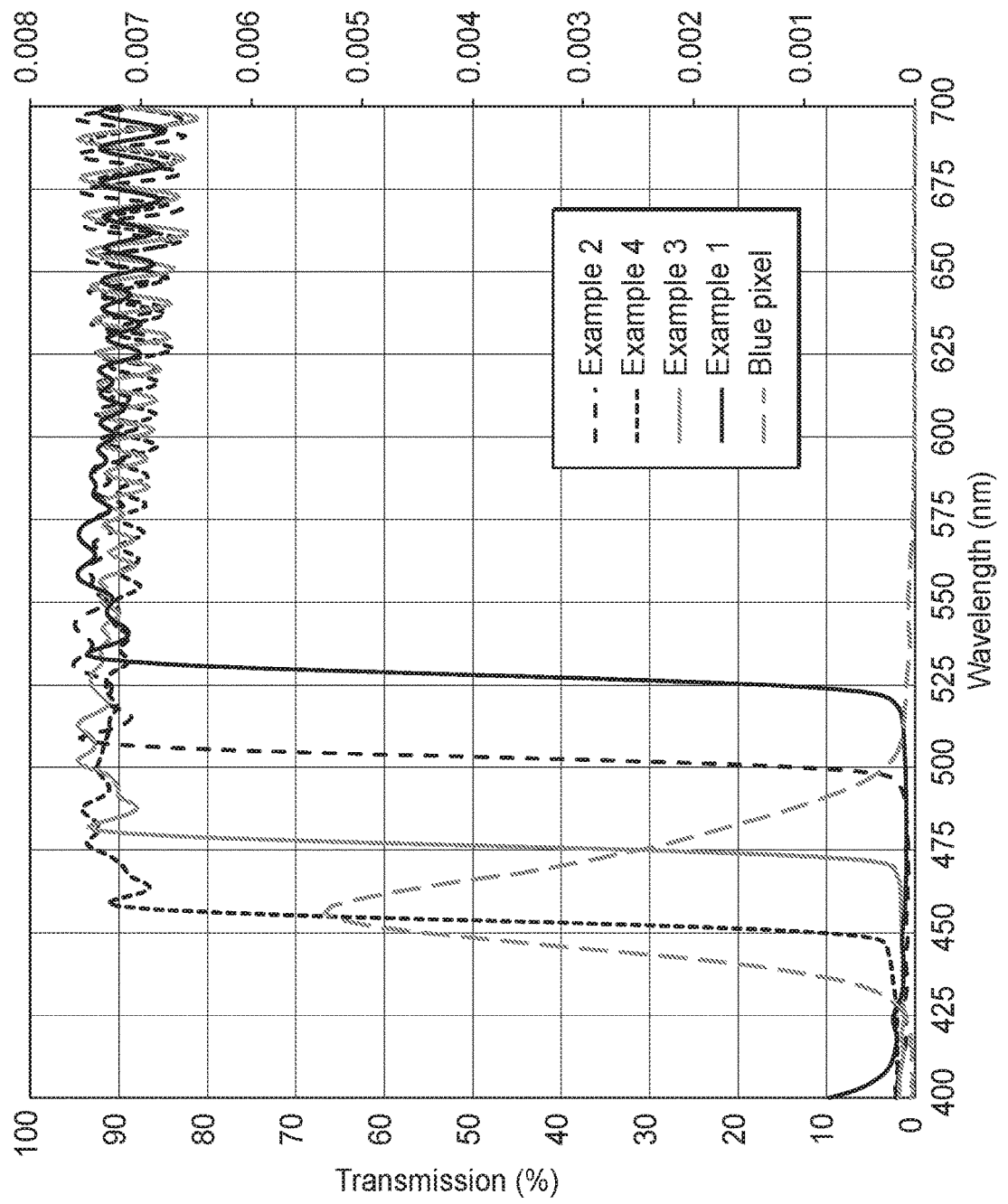
FIG. 9 is a plot of transmission of light having a block polarization state normally incident on reflective polarizers superimposed on the radiance of a blue pixel in an OLED display.

The transmission spectra for the reflective polarizers of Example 1-4 were measured for normal incidence light in the block polarization state and are shown in FIG. 9. The emission spectra for a blue pixel of an OLED TV display is also shown in FIG. 9. For each of the reflective polarizers of Examples 1-4, a best linear fit (linear least squares fit) to the band edge correlating the optical transmittance to wavelength at least across a wavelength range where the optical transmittance increases from about 20% of a maximum transmittance of the reflective polarizer in the visible wavelength range to about 70% of the maximum transmittance of the reflective polarizer in the visible wavelength range had a slope of about 13%/nm.

Figure 10:
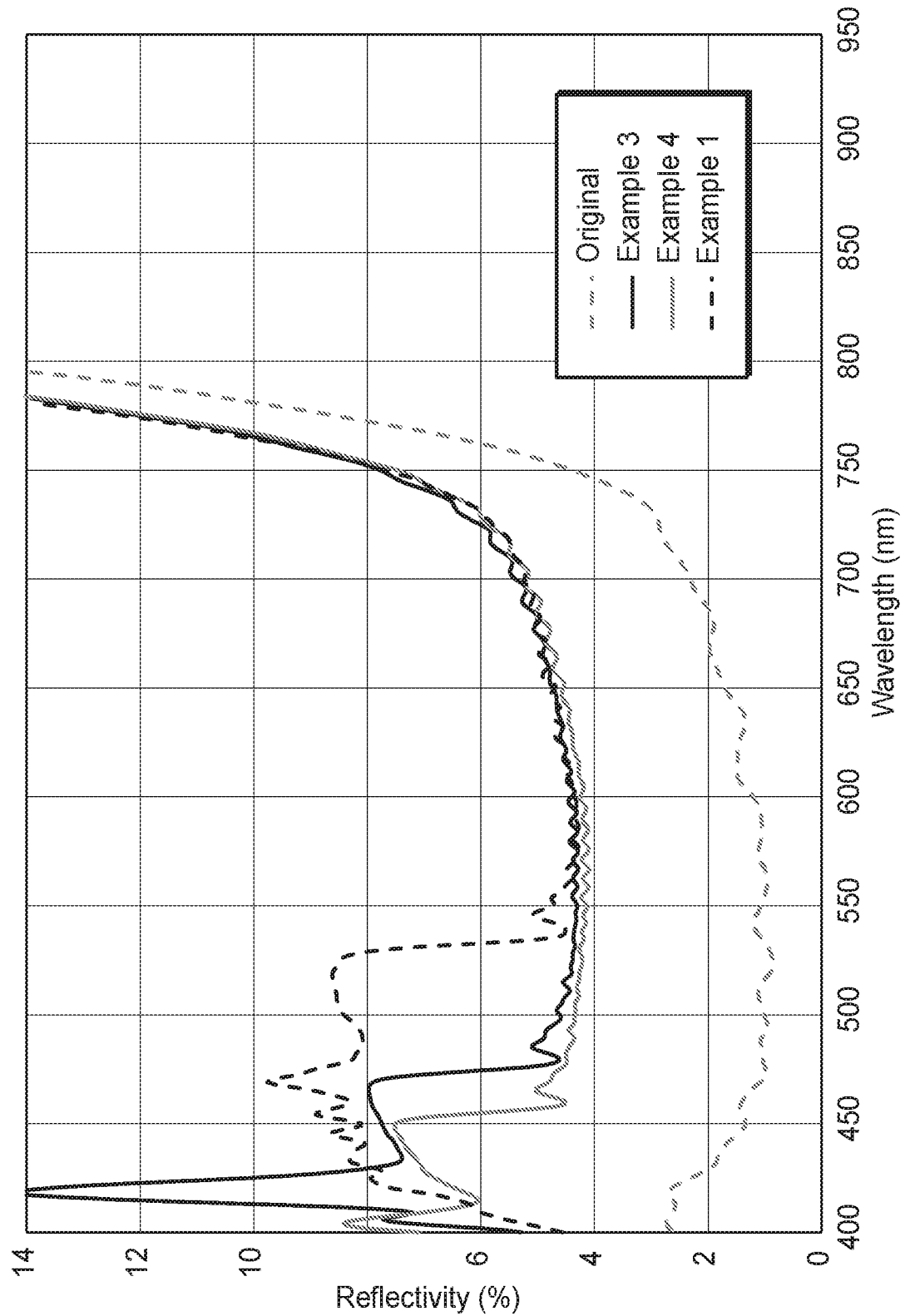
FIG. 10 is a plot of ambient light reflectivity from various displays.

The reflective polarizers were assembled into a circular polarizer by disposing the reflective polarizer between a Sanritz 5518 absorbing polarizer and an APQW92-004-PC-140NMHE (American Polarizers) quarter wave retarder with the pass axes of the absorbing and reflective polarizer aligned and with the fast axis of the quarter wave retarder at a 45 degree angle with the pass axes. The circular polarizer of an OLED TV display was removed and replaced with a circular polarizer including the reflective polarizer for each of Examples 1, 2, and 4. The ambient light photopic reflectance for unpolarized light at an 8 degree angle of incidence was measured and is shown in FIG. 10 for the original OLED TV display and for the display including the circular polarizer including the reflective polarizer for each of Examples 1, 2 and 4. The white and blue luminance gains and the photopic average (over visible wavelengths) ambient reflection were measured for the original OLED TV display (Original polarizer, which included an antireflection (AR) layer), for the display including the Sanritz polarizer and the quarter retarder but no reflective polarizer, for the display including the Sanritz polarizer and the quarter retarder a broadband APF reflective polarizer (available from 3M Company, St. Paul, MN) disposed therebetween, and for the display including the circular polarizer including the reflective polarizer for each of Examples 1, 2 and 4. The results are reported in the following table.

| Example | White Lum. Gain | Blue Lum. Gain | Ambient reflection at 8 degrees |
|---|---|---|---|
| Circular polarizer w/o AR | 96% | 95% | 4.21% |
| Original polarizer | 100% | 100% | 1.14% |
| APF | 150% | 142% | 8.32% |
| 1 | 118% | 138% | 5.62% |
| 2 | 106% | 127% | 4.51% |
| 4 | 105% | 118% | 4.27% |

Figure 11:
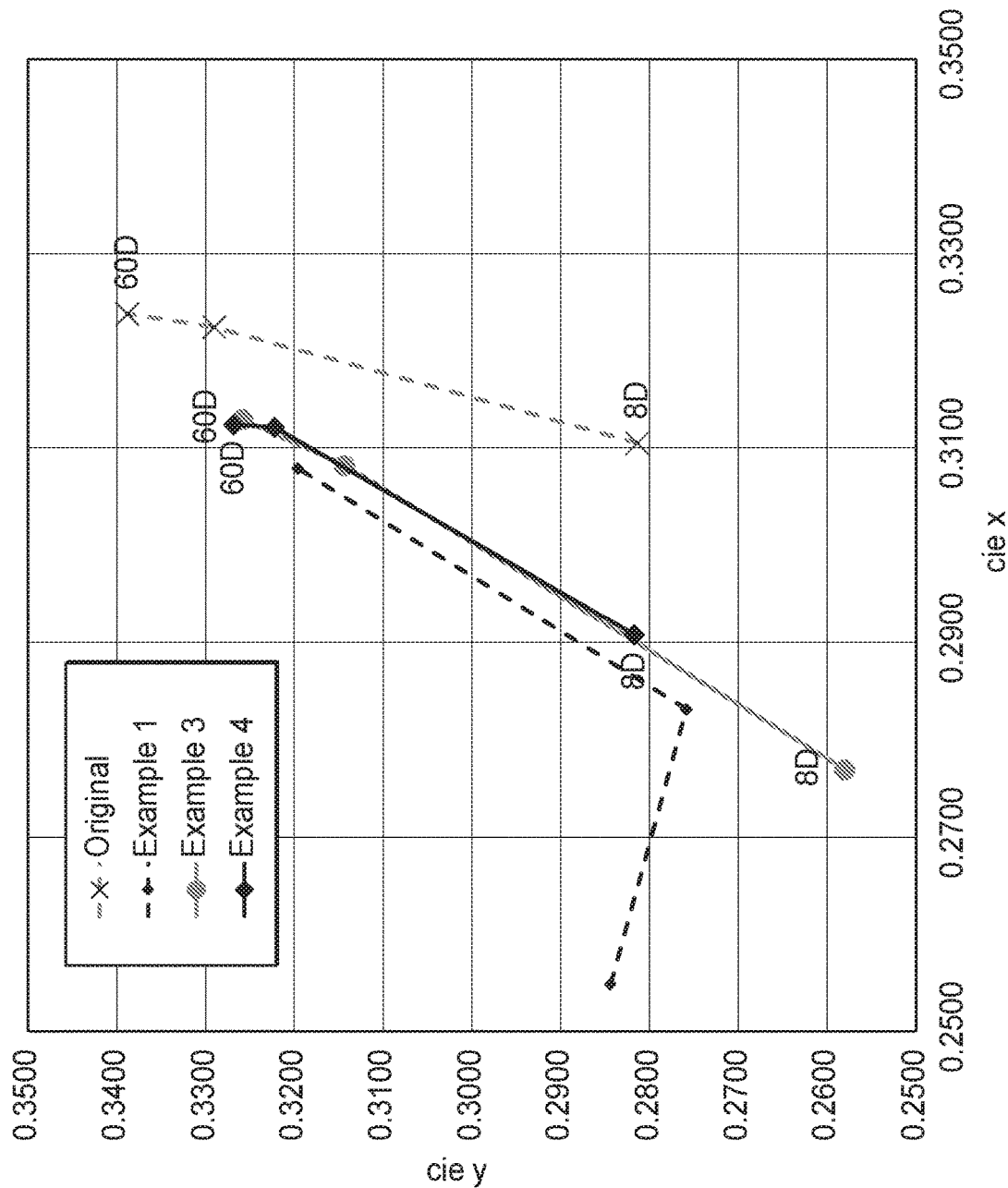
FIG. 11 is a plot of color shift in CIE 1931 xy chromaticity space of ambient reflection from various displays as the angle of incidence varies.

The color shift in CIE 1931 xy chromaticity space of ambient reflection as the angle of incidence varied from 8 degrees to 60 degrees was determined for various samples and is shown in FIG. 11.

Example 5

A computational model was used to calculate reflection and transmission properties of a reflective polarizer. The computational model was driven by a 4×4 matrix solver routine based on the Berriman algorithm where the reflection and transmission matrix elements can be computed for an arbitrary stack of 1-dimensional layers, with each layer defined by its physical thickness and the by a dispersive refractive index tensor where each principal element of the refractive index tensor is a function of wavelength ($\lambda$). With this computational model, a 1-dimensional stack structure that represents an emissive display was defined and its reflection and transmission properties were computed.

A coordinate system for the computational model was defined, with a cartesian set of axes, x, y and z, shown in FIG. 1A, where the x axis was as the "block axis", coincident with the high extinction axis of any absorbing polarizer and with the high-reflection axis of any reflective polarizer, and the y-axis was the "pass axis", coincident with the weakly absorbing, high transmission axis of the absorbing polarizer and the weakly reflecting axis of any reflective polarizer. The azimuthal angle $\varphi$ was measured from the x-axis and the polar angle $\theta$ was measured from the z-axis.

With this computational stack model, the viewer-side reflection characteristics of an Organic LED (OLED) display was modelled with a stack structure of a glass layer (the exterior surface of the display) overtop a circular polarizer, composed of a display-quality iodine-type absorbing polarizer, overlaying a quarter-wave ($\lambda$/4) retarder, where the retarder had an extraordinary axis that lied midway between the principal in-plane axes of the absorbing polarizer, and was chosen to be a green wavelength. Further, underneath the retarder layer, was a dielectric layer, representing the thin-film encapsulant (TFE) which in turn overlaid an OLED emission surface including spatially organized array of voltage-driven blue, green and red emission "pixels" areas, surrounded by metallic-like transistor elements and conducting elements that function as the drivers for the emissive pixels that form the display.

Computation was performed with input from the computational stack model, to predict the degree of brightness increase of the intensity of the blue, green and red pixel emitted light from an OLED emission surface. These predictions were based on analysis of the stack-model-computed reflection and transmission coefficient spectra, coupled with an understanding of the reflection spectrum of the OLED emission surface. Analytic expressions were derived to predict pixel emission color and brightness change that results when a reflective polarizer is included in the circular polarizer of a modelled OLED display stack.

A multilayer optical film reflective polarizer was modeled that included a total of 44 optical repeat units (ORUs) that were modeled as being composed of alternating microlayers of 90/10 coPEN and low refractive index isotropic microlayers. The isotropic layers were modeled as being made as follows. A blend of polycarbonate and copolyesters (PCTg) is made as described in U.S. Pat. No. 10,185,068 (Johnson et al.) such that the index is about 1.57 and such that the layers remains substantially isotropic upon uniaxial orientation of the film. The PC:PCTg molar ratio is approximately 85 mol % PC and 15 mol % PCTg. The PC:PCTg is then blended with PETg at an 85:15 weight ratio ((PC:PCTg):PETg). The high index material, 90/10 coPEN, is referred to as material A, and the low index material is referred to as material B.

A thickness profile of microlayer A and B pairs, or ORUs, was mathematically generated. The phase thickness of the $1^{st}$ A/B layer pair, is prescribed as $1/2\lambda_0$ (wavelength), wherein $\lambda_0$ is in the deep blue, at approximately 420 nm wavelength. Adjacent A/B ORUs had their physical thicknesses adjusted to have a phase thickness of $1/2\lambda_i$, where $\lambda_i$ was incrementally larger than $\lambda$. Further adjoining A/B layer pairs had their phase thickness adjusted to be $1/2\lambda_{i+1}$ and so on up through the entire optical film stack, until the last A/B layer pair is reached, with a phase thickness that was $1/2\lambda_N$, where $\lambda_N$ was approximately 580 nm. For this computational example, the film stack included a total of 44 A/B layer pairs, in a monotonic, non-linear A/B ORU profile. In addition, within each A/B layer pair, both the A layer and B layer had an individual phase thickness that was $1/4\lambda_i$.

Figure 12:
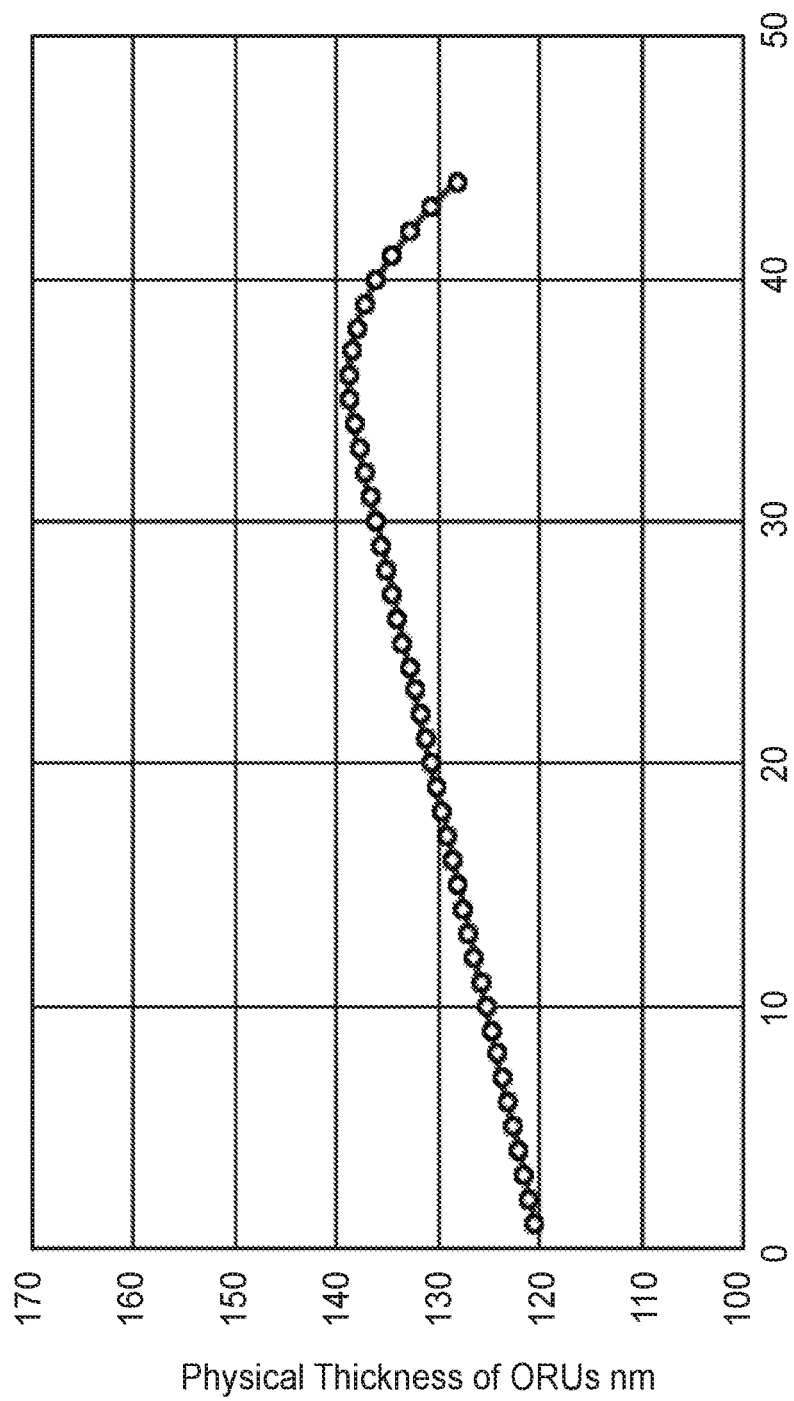
FIG. 12 is a plot of a thickness profile of optical repeat units in a reflective polarizer.

The physical thickness profile for ORUs is shown in FIG. 12. The ORU thickness profile was bounded on both sides by a protective boundary layer of the low index material with a thickness of 1500 nm.

Representative values of the refractive index for the high index optical (HIO) layers (the birefringent 90/10 coPEN), denoted Nx, Ny, Nz along the x, y, z axes, respectively, and for the isotropic low index optical (LIO) layers (Niso is used to denote isotropic refractive indices) are shown in the following table:

| | HIO | | | LIO |
|---|---|---|---|---|
| $\lambda$ | Nx | Ny | Nz | Niso |
| 450 nm | 1.9222 | 1.6087 | 1.5987 | 1.5962 |
| 530 nm | 1.8611 | 1.5794 | 1.5696 | 1.5801 |
| 630 nm | 1.8266 | 1.5651 | 1.5554 | 1.5701 |

Further, the model set-up defined a 400 micrometer glass layer followed by a display absorbing polarizer above the multilayer optical film reflective polarizer. The refractive indices for glass and the dielectric layer immediately above the OLED emission surface are shown in the following table.

| λ | Glass Niso | Dielectric Niso |
|---|---|---|
| 450 nm | 1.5252 | 1.5057 |
| 530 nm | 1.5195 | 1.4987 |
| 630 nm | 1.5151 | 1.4937 |

The absorbing polarizer was modelled after a Sanritz display polarizer and assumed to be 10 micrometers thick. The refractive index (Niso) and the loss (Kx, Ky, Kz) for the absorbing polarizer are shown in the following table.

| | Absorbing Polarizer | | | |
|---|---|---|---|---|
| λ | Niso | Kx | Ky | Kz |
| 450 nm | 1.5043 | 3.527E−02 | 7.367E−04 | 7.367E−04 |
| 530 nm | 1.4983 | 4.387E−02 | 4.732E−04 | 4.732E−04 |
| 630 nm | 1.4953 | 5.242E−02 | 5.084E−04 | 5.084E−04 |

In the model, a quarter-wave retarder layer was situated below the reflective polarizer, with its extraordinary axis No, aligned midway at 45 degrees between the x-axis and the y-axis. The refractive index values for the retarder are shown in the following table, as are the deviation values Δ (in nanometers) from quarter-wave, at the representative wavelengths. These retarder properties were manipulated in the model by changing the retarder thickness.

| | Retarder | | | |
|---|---|---|---|---|
| λ | Ne | No | No | Δ |
| 450 nm | 1.5043 | 1.4903 | 1.4903 | 24.13 |
| 530 nm | 1.4983 | 1.4843 | 1.4843 | 4.48 |
| 630 nm | 1.4953 | 1.4813 | 1.4813 | 21.37 |

The OLED emission surface was defined in the model as having metal-like phase rotation properties upon reflection and with reflection coefficient values shown in the following table.

| λ | Refl. coef. |
|---|---|
| 450 nm | 0.3336 |
| 530 nm | 0.4895 |
| 630 nm | 0.5570 |

The absorption coefficients for all of the layers in the OLED model, except for the absorbing polarizer, were taken to be insignificantly small.

Figure 13:
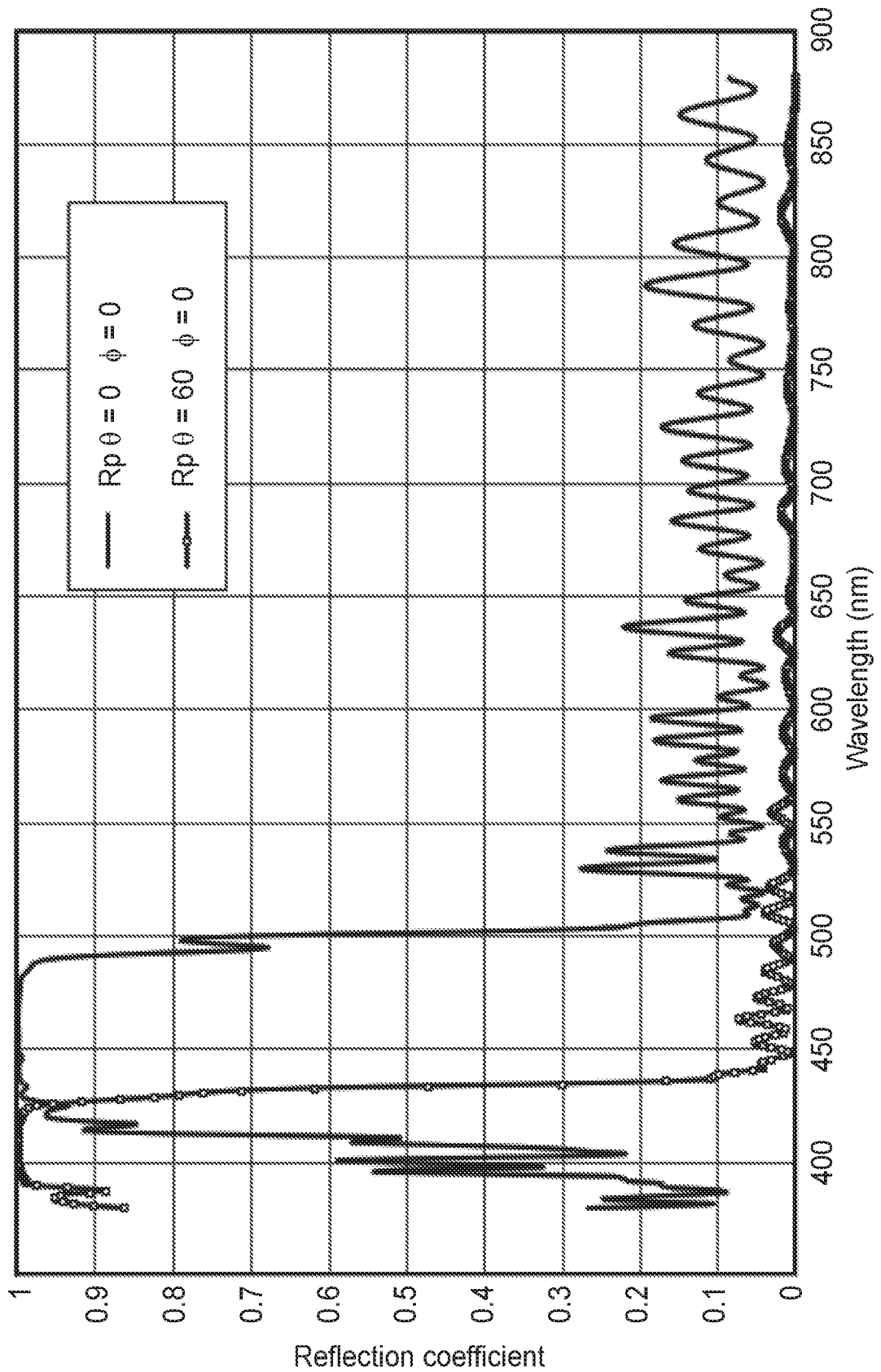
FIG. 13 is a plot of reflection coefficients for a reflective polarizer for normal incidence and for a 60 degree angle of incidence.

FIG. 13 shows the computed reflection coefficient (fraction of incident that is light reflected) for the multilayer optical film reflective polarizer in air for electric field aligned with the x-axis, and for polar angles of 0 degrees and 60 degrees. For the electric field aligned with the y-axis, the reflection coefficients oscillated around average values of about 0.1 and 0.33 for polar angles of 0 degrees and 60 degrees, respectively, for wavelengths between about 430 and 850 nm.

The computational model was set up to compute the ambient reflection for the circular polarizer. A D65 light source was incorporated in the computation. The CIE 1931 xy chromaticity coordinates for the D65 light source was x=0.3127 and y=0.3291. The normal incidence photopic reflectance for ambient D65 incident light was 5.24%.

Terms such as "about" will be understood in the context in which they are used and described in the present description by one of ordinary skill in the art. If the use of "about" as applied to quantities expressing feature sizes, amounts, and physical properties is not otherwise clear to one of ordinary skill in the art in the context in which it is used and described in the present description, "about" will be understood to mean within 10 percent of the specified value. A quantity given as about a specified value can be precisely the specified value. For example, if it is not otherwise clear to one of ordinary skill in the art in the context in which it is used and described in the present description, a quantity having a value of about 1, means that the quantity has a value between 0.9 and 1.1, and that the value could be 1.

All references, patents, and patent applications referenced in the foregoing are hereby incorporated herein by reference in their entirety in a consistent manner In the event of inconsistencies or contradictions between portions of the incorporated references and this application, the information in the preceding description shall control.

Descriptions for elements in figures should be understood to apply equally to corresponding elements in other figures, unless indicated otherwise. Although specific embodiments have been illustrated and described herein, it will be appreciated by those of ordinary skill in the art that a variety of alternate and/or equivalent implementations can be substituted for the specific embodiments shown and described without departing from the scope of the present disclosure. This application is intended to cover any adaptations or variations of the specific embodiments discussed herein. Therefore, it is intended that this disclosure be limited only by the claims and the equivalents thereof.

What is claimed is:

1. An optical system comprising:
   an emissive display configured to emit an image and comprising a blue pixel configured to emit a blue light, the emitted blue light having a blue peak at a blue wavelength λb;
   a linear absorbing polarizer layer disposed on the display; and
   a reflective polarizer disposed between the linear absorbing polarizer layer and the display and configured to receive the image emitted by the display, for substantially normally incident light: for the blue wavelength λb, the reflective polarizer reflects at least 30% of the incident light having a first polarization state and transmits at least 75% of the incident light having an orthogonal second polarization state; and for at least one wavelength λi greater than λb, λi−λb<50 nm, the reflective polarizer transmits at least 75% of the incident light for each of the first and second polarization states; and for the blue wavelength λb, the reflective polarizer has a maximum optical transmittance $T_{max}$ for light incident at a first incident angle, and an optical transmittance $T_{max}/2$ for light incident at a second incident angle greater than the first incident angle by less than about 50 degrees.

2. The optical system of claim 1, wherein the emissive display is configured to emit an image in a visible wavelength range extending at least from about 420 nm to about 650 nm, wherein for the substantially normally incident light and for the first polarization state, an optical transmittance of the reflective polarizer comprises a band edge at least a portion of which is disposed in the visible wavelength range, such that a best linear fit to the band edge correlating the optical transmittance to wavelength at least across a wavelength range where the optical transmittance increases from about 20% of a maximum transmittance of the reflective polarizer in the visible wavelength range to about 70% of the maximum transmittance of the reflective polarizer in the visible wavelength range has a slope that is greater than about 7%/nm.

3. The optical system of claim 1, wherein the first incident angle is about zero.

4. The optical system of claim 1, wherein for a substantially normally incident light having a red wavelengths $\lambda r$, the reflective polarizer transmits at least 40% of the incident light for each of the first and second polarization states; and for a light having a red wavelength $\lambda r$ and incident at an incident angle greater than about 20 degrees, the reflective polarizer reflects at least 50% of light having the first polarization state and transmits at least 50% of light having the second polarization state.

* * * * *